(12) United States Patent
Urakami et al.

(10) Patent No.: US 7,838,995 B2
(45) Date of Patent: Nov. 23, 2010

(54) SEMICONDUCTOR DEVICE HAVING P-N COLUMN PORTION

(75) Inventors: Yasushi Urakami, Obu (JP); Hitoshi Yamaguchi, Nisshin (JP); Jun Sakakibara, Nagoya (JP)

(73) Assignee: Denso Corporation, Kariya (JP)

( * ) Notice: Subject to any disclaimer, the term of this patent is extended or adjusted under 35 U.S.C. 154(b) by 111 days.

(21) Appl. No.: 12/216,808

(22) Filed: Jul. 10, 2008

(65) Prior Publication Data
US 2009/0032965 A1    Feb. 5, 2009

(30) Foreign Application Priority Data
Jul. 13, 2007    (JP)    ............... 2007-184736

(51) Int. Cl.
*H01L 23/48*    (2006.01)
(52) U.S. Cl.    .................. 257/774; 257/773; 257/E23.01
(58) Field of Classification Search    ............ 257/E23.01, 257/773, 774
See application file for complete search history.

(56) References Cited

U.S. PATENT DOCUMENTS

| 7,037,789 B2 | 5/2006 | Yamauchi et al. |
| 7,417,284 B2 | 8/2008 | Yamauchi et al. |
| 7,541,643 B2 | 6/2009 | Ono et al. |
| 7,553,731 B2 | 6/2009 | Yamauchi et al. |
| 2006/0043480 A1 | 3/2006 | Tsuchitani et al. |
| 2006/0124997 A1* | 6/2006 | Yamauchi et al. ........... 257/330 |
| 2006/0231917 A1* | 10/2006 | Ono et al. .................. 257/500 |
| 2007/0238271 A1 | 10/2007 | Yamauchi et al. |

FOREIGN PATENT DOCUMENTS

JP    A-2003-007676    1/2003

OTHER PUBLICATIONS

Office Action issued from the Japanese Patent Office on Aug. 18, 2009 in the corresponding Japanese patent application No. 2007-184736 (and English translation).

* cited by examiner

*Primary Examiner*—Bradley K Smith
*Assistant Examiner*—Marvin Payen
(74) *Attorney, Agent, or Firm*—Posz Law Group, PLC

(57) ABSTRACT

A semiconductor device includes: a first semiconductor layer; a p-n column portion over the first semiconductor layer and including second and third semiconductor layers, which are alternately arranged; and a peripheral portion adjacently to the p-n column portion and including a fourth semiconductor layer. An end second semiconductor layer has an impurity amount equal to or larger than a half of other second semiconductor layers. The third semiconductor layers include a large impurity amount portion adjacent to the end second semiconductor layer. The large impurity amount portion includes at least one third semiconductor layer having an impurity amount larger than an impurity amount of other third semiconductor layers.

6 Claims, 12 Drawing Sheets

SEMICONDUCTOR DEVICE HAVING P-N COLUMN PORTION

CROSS REFERENCE TO RELATED APPLICATION

This application is based on Japanese Patent Application No. 2007-184736 filed on Jul. 13, 2007, the disclosure of which is incorporated herein by reference.

FIELD OF THE INVENTION

The present invention relates to a semiconductor device having a p-n column portion.

BACKGROUND OF THE INVENTION

As a semiconductor device that enables the enhancement of a breakdown voltage and the reduction of on-state resistance, there have been conventionally known the following semiconductor devices: semiconductor devices having a p-n column portion where an n-type semiconductor layer and a p-type semiconductor layer are alternately and adjacently placed, and the devices providing a vertical element using either the n-type semiconductor layer or the p-type semiconductor layer as a drift layer. To ensure a certain breakdown voltage of the whole of such a semiconductor device, a construction has been proposed. In this construction, a semiconductor layer having a lower concentration than that of the same conductivity type semiconductor layer constructing the p-n column portion is provided as a peripheral portion positioned in the vicinity of the p-n column portion. (Refer to JP-B1-3743395 corresponding to U.S. Pat. No. 7,037,789 and JP-A-2003-7676.) By providing the low-concentration semiconductor layer as a peripheral portion, as mentioned above, a depletion layer can be widely expanded in the lateral direction.

To widely expand the depletion layer in the lateral direction (i.e., the direction of juxtaposition of n-type semiconductor layers and p-type semiconductor layers) when the device is off, it is required to ensure a charge balance. With this taken into account, p-n column portions are so set that n-type semiconductor layers and p-type semiconductor layers are equal to each other in impurity amount. However, constructions provided with a low-concentration semiconductor layer as a peripheral portion involve difficulties. Since the low-concentration semiconductor layer exists, a charge balance can be accordingly disrupted in proximity to an end of the p-n column portion, so that the breakdown voltage is reduced.

Thus, it is required for the semiconductor device to improve the breakdown voltage of the entire device.

SUMMARY OF THE INVENTION

In view of the above-described problem, it is an object of the present disclosure to provide a semiconductor device having a p-n column portion.

According to a first aspect of the present disclosure, a semiconductor device includes: a first semiconductor layer having a first conductivity type; a p-n column portion stacked over the first semiconductor layer and including a plurality of second semiconductor layers and a plurality of third semiconductor layers, wherein each second semiconductor layer has the first conductivity type and provides a drift layer, each third semiconductor layer has a second conductivity type, and the second and third semiconductor layers are alternately and adjacently arranged in a juxtaposing direction perpendicular to a stacking direction of the p-n column portion; and a peripheral portion disposed adjacently to the p-n column portion in the juxtaposing direction and including at least a fourth semiconductor layer with the first conductivity type. The fourth semiconductor layer has an impurity concentration lower than each second semiconductor layer. The second semiconductor layers include an end second semiconductor layer, which contacts the peripheral portion in the juxtaposing direction. The end second semiconductor layer has an impurity amount, which is equal to or larger than a half of an impurity amount of other second semiconductor layers. The third semiconductor layers include a large impurity amount portion adjacent to the end second semiconductor layer. The large impurity amount portion includes at least one third semiconductor layer having an impurity amount, which is larger than an impurity amount of other third semiconductor layers.

In the above device, a charge balance near the end second semiconductor layer in the p-n column portion is held. Thus, the breakdown voltage of the device is improved.

According to a second aspect of the present disclosure, a semiconductor device includes: a first semiconductor layer having a first conductivity type; a p-n column portion stacked over the first semiconductor layer, and including a plurality of second semiconductor layers and a plurality of third semiconductor layers, wherein each second semiconductor layer has the first conductivity type and provides a drift layer, and each third semiconductor layer has a second conductivity type, and wherein the second and third semiconductor layers are alternately and adjacently arranged in a juxtaposing direction perpendicular to a stacking direction of the p-n column portion; and a peripheral portion disposed adjacently to the p-n column portion in the juxtaposing direction, and including at least a fourth semiconductor layer with the first conductivity type. The fourth semiconductor layer has an impurity concentration lower than each second semiconductor layer. The third semiconductor layers include an end third semiconductor layer, which contacts the peripheral portion in the juxtaposing direction. The end third semiconductor layer has an impurity amount, which is equal to or larger than a half of an impurity amount of other third semiconductor layers. The second semiconductor layers include a small impurity amount portion adjacent to the end third semiconductor layer. The small impurity amount portion includes at least one second semiconductor layer having an impurity amount, which is smaller than an impurity amount of other second semiconductor layers.

In the above device, a charge balance near the end third semiconductor layer in the p-n column portion is held. Thus, the breakdown voltage of the device is improved.

According to a third aspect of the present disclosure, a semiconductor device includes: a first semiconductor layer having a first conductivity type; a p-n column portion stacked over the first semiconductor layer, and including a plurality of second semiconductor layers and a plurality of third semiconductor layers, wherein each second semiconductor layer has the first conductivity type and provides a drift layer, and each third semiconductor layer has a second conductivity type, and wherein the second and third semiconductor layers are alternately and adjacently arranged in a juxtaposing direction perpendicular to a stacking direction of the p-n column portion; and a peripheral portion disposed adjacently to the p-n column portion in the juxtaposing direction, and including at least a fourth semiconductor layer with the first conductivity type. The fourth semiconductor layer has an impurity concentration lower than each second semiconductor layer. The third semiconductor layers include an impurity amount portion adjacent to a boundary between the p-n column portion and the peripheral portion. The impurity amount portion has a total impurity amount substantially equal to a sum of an impurity amount of the fourth semiconductor layer and a total impurity amount of a part of the second semiconductor layers disposed between the boundary and a middle line. The middle line is defined as a center line of one of the second semiconductor layers, which is adjacent to the impurity amount portion and opposite to the boundary.

In the above device, a charge balance near the boundary is held. Thus, the breakdown voltage of the device is improved.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

The present invention relates to a semiconductor device having a p-n column portion where an n-type semiconductor layer and a p-type semiconductor layer are alternately and adjacently placed. The p-n column portion provides a vertical element using either the n-type semiconductor layer or the p-type semiconductor layer as a drift layer.

Figure 1:
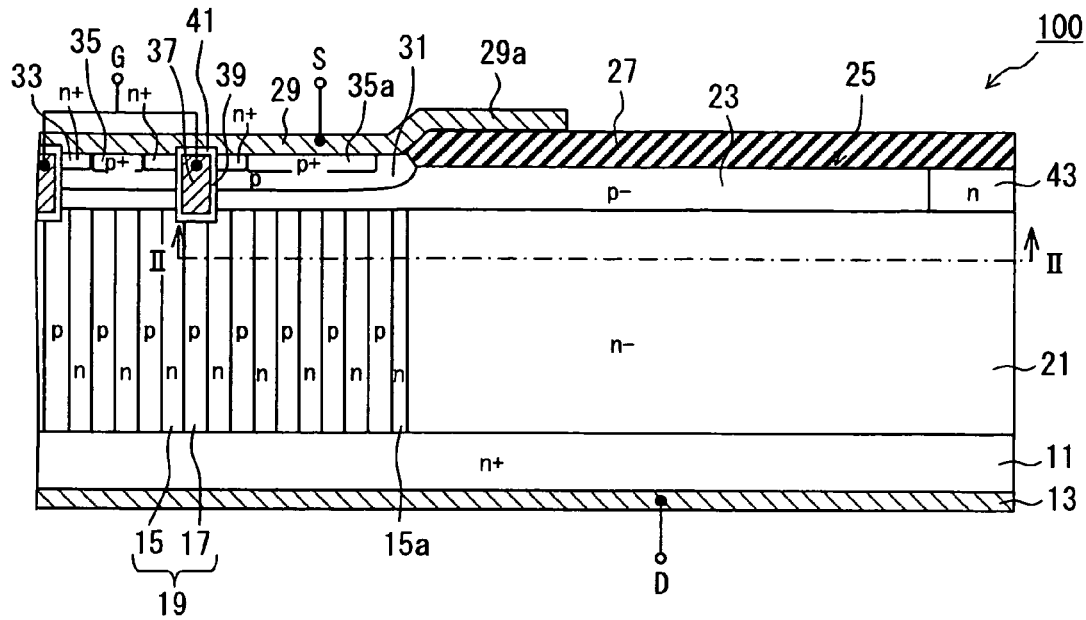
FIG. 1 is a sectional view illustrating the general configuration of a related art semiconductor device as a comparison having a p-n column portion formed by a trench burying method.
Figure 2:
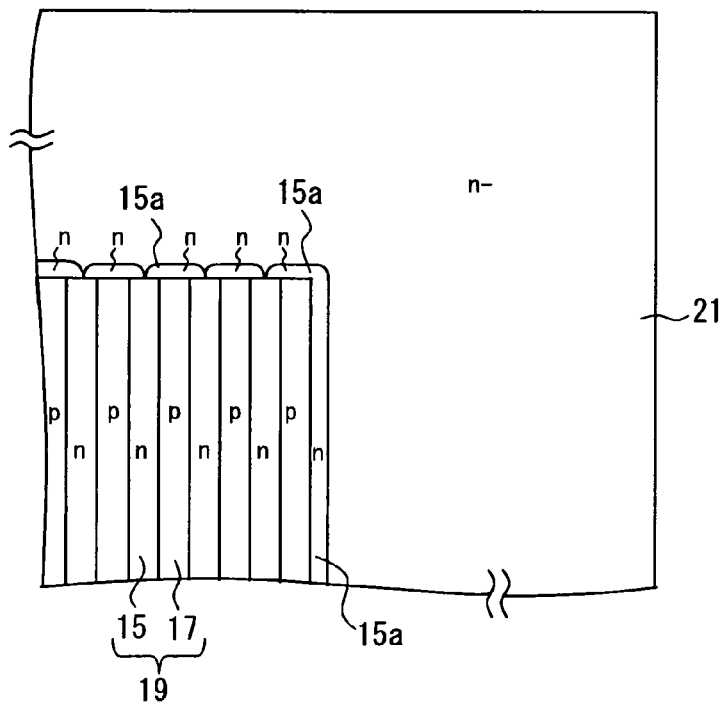
FIG. 2 is a sectional view taken along line II-II of FIG. 1.

Description will be given to the circumstances that led the present inventors to making the invention before the embodiments of the invention are described. FIG. 1 is a sectional view illustrating the general configuration of a semiconductor device having a p-n column portion formed by a trench burying method. FIG. 2 is a sectional view taken along line II-II of FIG. 1.

The present inventors conducted a close study of a semiconductor device. The semiconductor device had a p-n column portion (so-called p-n juxtaposed portion) where an n-type semiconductor layer and a p-type semiconductor layer are alternately and adjacently placed. It is provided with a vertical element having either an n-type semiconductor layer or a p-type semiconductor layer as a drift layer. The semiconductor device is so constructed that as a peripheral portion positioned in the vicinity of the p-n column portion, there is provided a semiconductor layer lower in concentration than a semiconductor layer of the same conductivity type constructing the p-n column portion.

In this study, the semiconductor device illustrated in FIG. 1 and FIG. 2 is formed by the above-mentioned trench burying method. The p-n column portion is formed by taking the following procedure: an n-type impurity is implanted by vapor-phase diffusion (e.g., $PH_3$) and a p-type semiconductor layer is formed in trenches by epitaxial growth. The semiconductor device 100 illustrated in FIG. 1 and FIG. 2 has MOSFET as a vertical element. It adopts an $n^+$-type substrate 11 in which silicon is heavily doped with an n-type impurity as a first semiconductor layer of the n-conductivity type as a drain region. This $n^+$-type substrate 11 of high concentration (low resistance) is continuously formed astride the p-n column portion and a peripheral portion positioned in the vicinity of the p-n column portion.

A drain electrode 13 as a main electrode is disposed over the surface of the $n^+$-type substrate 11 on one side. A p-n column portion 19 is constructed over part of the $n^+$-type substrate 11 on the opposite side to the drain electrode placement surface. The p-n column portion is constructed as follows: an n-type semiconductor layer 15 as a second semiconductor layer of a first conductivity type and a p-type semiconductor layer 17 as a third semiconductor layer of a second conductivity type are alternately and adjacently placed. These semiconductor layers are placed in one direction orthogonal to the direction of lamination of the $n^+$-type substrate 11. In the p-n column portion 19, the n-type semiconductor layers 15 make a drift region of the vertical element. In the direction of juxtaposition of the n-type semiconductor layers 15 and the p-type semiconductor layers 17, an n-type semiconductor layer 15 is an end semiconductor layer 15a. The impurity amount of the end semiconductor layer 15a is not less than ½ of the impurity amount of each of the other n-type semiconductor layers 15 because of the influence of vapor-phase diffusion. The n-type semiconductor layers 15 are formed by vapor-phase diffusion into a semiconductor layer from trenches on both sides in the direction of juxtaposition. Ideally, therefore, the impurity amount of the end semiconductor layer 15a is approximately ½ of the impurity amount of each of the other n-type semiconductor layers 15. (In other words, the width of the end semiconductor layer 15a is approximately ½ of the width of each of the n-type semiconductor layers 15 in the direction of juxtaposition.) When the width of a semiconductor layer between trenches is small, impurities can pass through the semiconductor layer but impurities do not pass through the end semiconductor layer 15a. In this case, therefore, the impurity amount of the end semiconductor layer 15a becomes larger than ½ of the impurity amount of each of the other n-type semiconductor layers 15. (In other words, the width of the end semiconductor layer 15a becomes larger than ½ of the width of each of the n-type semiconductor layers 15 in the direction of juxtaposition.) A charge balance is ensured in impurity amount between the n-type semiconductor layers 15 and the p-type semiconductor layers 17.

Over the surface of the n+-type substrate 11 on the opposite side to the drain electrode placement surface, an n⁻-type semiconductor layer 21 is disposed as a fourth semiconductor layer of the first conductivity type. The n⁻-type semiconductor layer is so disposed that it encircles the p-n column portion 19 and is lower in impurity concentration (higher in resistance) than the n-type semiconductor layers 15. Over the surfaces of the p-n column portion 19 and the n⁻-type semiconductor layer 21 on the opposite side to the n⁺-type substrate 11, a p⁻-type semiconductor layer 23 is formed as a fifth semiconductor layer of the second conductivity type. The p⁻-type semiconductor layer is continuously formed astride the p-n column portion 19 and the n⁻-type semiconductor layer 21. That is, the semiconductor device 100 includes the following as a peripheral portion 25 positioned in the vicinity of the p-n column portion 19 in the direction of juxtaposition: the n⁻-type semiconductor layer 21 and part of the p⁻-type semiconductor layer 23 laminated over the n⁻-type semiconductor layer 21.

Over the surface of the peripheral portion 25 in the p⁻-type semiconductor layer 23, a field oxide film 27 is formed as an insulating layer. Over the surface of the field oxide film 27 at least on the p-n column portion 19 side, a field plate 29a as a conductor layer is disposed. This field plate 29a forms part of a source electrode 29 as a main electrode.

In the surficial layer of the portion of the p⁻-type semiconductor layer 23 positioned above the p-n column portion 19, there is formed a p-type base region 31 higher in impurity concentration than the p⁻-type semiconductor layer 23. In the surficial layer of the base region 31, n⁺-type source regions 33 and p⁺-type base contact regions 35 are selectively formed. The source regions 33 and the base contact regions 35 are electrically connected with the source electrode 29. Of the base contact regions 35, one positioned outermost in the direction of juxtaposition will be designated as outermost base contact region 35a in distinction from the other base contact regions 35.

A trench gate electrode 37 is formed so that it penetrates the base region 31 and the p⁻-type semiconductor layer 23 separating the source regions 33 and the n-type semiconductor layers 15 from each other. This trench gate electrode 37 is covered with a gate insulating film 39. The source electrode 29 and the trench gate electrode 37 are electrically isolated from each other by an interlayer insulating film 41. Reference numeral 43 found in FIG. 1 denotes an n-well provided at an end of the peripheral portion 25 adjacently to the p⁻-type semiconductor layer 23 for suppressing leakage during dicing.

Figure 3:
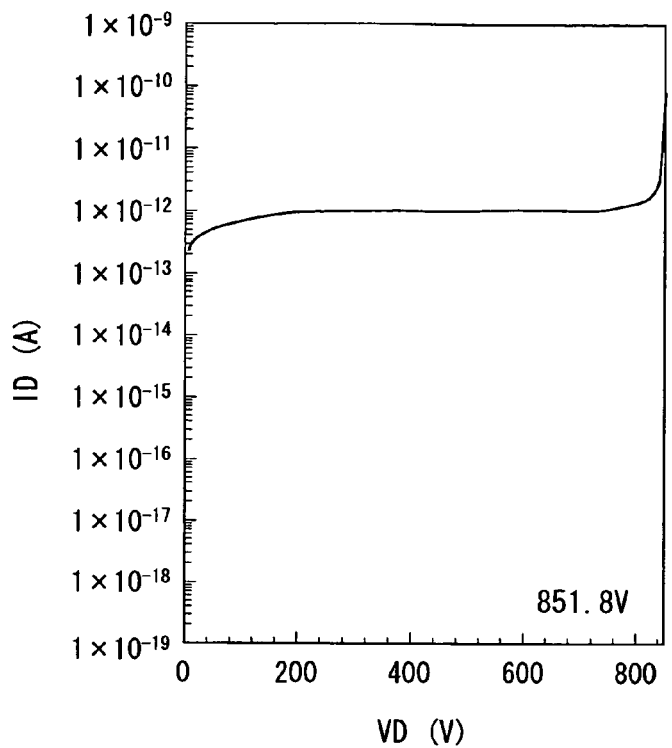
FIG. 3 is a drawing illustrating the relation between drain-source voltage and drain current.
Figure 4:
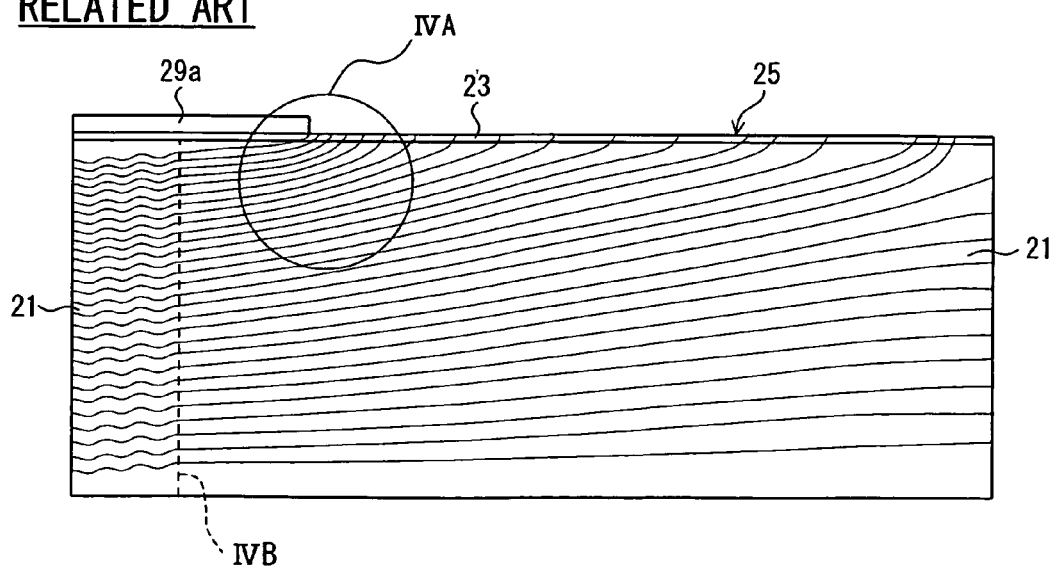
FIG. 4 is a drawing illustrating an electric potential distribution at the time of breakdown.

The present inventors calculated breakdown voltage with respect to the semiconductor device 100 of the above structure by simulation. FIG. 3 and FIG. 4 indicate the result of the calculation. FIG. 3 indicates the relation between drain-source voltage and drain current. FIG. 4 indicates an electric potential distribution at the time of breakdown. In FIG. 4, the boundary IVB between the p-n column portion 19 and the n⁻-type semiconductor layer 21 is indicated by broken line. For the simulation, the impurity concentrations of the n-type semiconductor layers 15 and the p-type semiconductor layers 17 constructing the p-n column portion 19 are both set to $8 \times 10^{15}$ cm$^{31}$. The n-type semiconductor layers 15 other than the end semiconductor layer 15a and the p-type semiconductor layers 17 are made equal in width in the direction of juxtaposition. Further, the n-type semiconductor layers 15 and the p-type semiconductor layers 17 are made equal to each other in length in the direction of lamination and in the direction orthogonal to the direction of juxtaposition and in thickness in the direction of lamination. (The direction orthogonal to the direction of juxtaposition is equivalent to the direction of length of the semiconductor layers 15, 17. It will be hereafter simply referred to as the direction of length.) This is in order that the p-n column portion 19 could ensure a breakdown voltage not less than 900V as a target breakdown voltage. The length of the n⁻-type semiconductor layer 21 in the direction of length and its thickness in the direction of lamination are made equal to those of the p-n column portion 19, and its impurity concentration is set to $1 \times 10^{14}$ cm$^{-3}$.

As a result, a breakdown occurred in the peripheral portion 25 (p⁻-type semiconductor layer 23) positioned under an end of the field plate 29a. As illustrated in FIG. 3, it is revealed that only a breakdown voltage of approximately 852V could be ensured as compared with the target breakdown voltage (900V or above). As illustrated in FIG. 4, the electric potential distribution at the time of the breakdown is as follows: the electric potential distribution is dense at the upper part IVA of the p-n column portion 19; and the electric potential is bent at the end of the field plate 29a and electric fields are concentrated under the end of the field plate 29a. The present inventors inferred that this electric field concentration is caused by the following: a charge balance is disrupted in proximity to the end of the p-n column portion 19 in the direction of juxtaposition by an amount equivalent to the impurity amount of at least part of the n⁻-type semiconductor layer 21 existing around the p-n column portion 19. Consequently, the present inventors consider that the following could be implemented by structuring not only the p-n column portion 19 but also the peripheral portion 25 so that a charge balance is endured in them: the breakdown voltage of the peripheral portion 25 is enhanced and then the breakdown voltage of the entire semiconductor device 100 is enhanced.

First Embodiment

Figure 5:
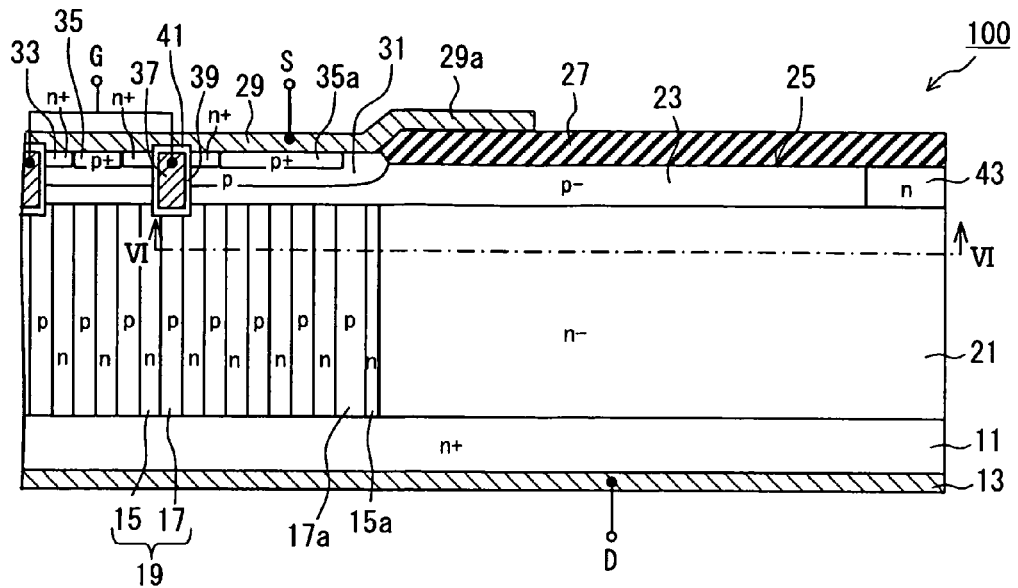
FIG. 5 is a sectional view illustrating the general configuration of a semiconductor device in a first embodiment.
Figure 6:
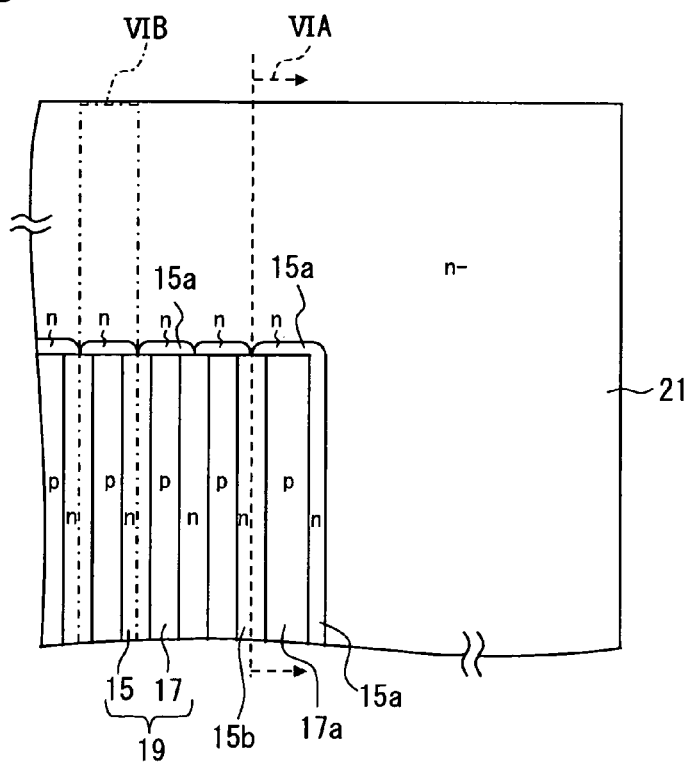
FIG. 6 is a sectional view taken along line VI-VI of FIG. 5.

FIG. 5 is a sectional view illustrating the general configuration of a semiconductor device in a first embodiment. FIG. 6 is a sectional view taken along line VI-VI of FIG. 5. The same components as illustrated in FIG. 1 and FIG. 2 will be marked with the same reference numerals.

The semiconductor device in this embodiment is also formed by a publicly known trench burying method. Its basic configuration is the same as that of the semiconductor device 100 illustrated in FIG. 1 and FIG. 2. Hereafter, description will be given with a focus on a difference. The manufacturing method is described in, for example, JP-A-2006-173202 corresponding to US Patent Application Publication No. 2007-0238271, and its description will be omitted in the description of this embodiment.

As illustrated in FIG. 5 and FIG. 6, the following measure is taken in the semiconductor device 100 in this embodiment. The drain electrode 13 is disposed over the surface of the $n^+$-type substrate 11 as a drain region on one side, and the p-n column portion 19 is disposed on part of its surface on the opposite side to the drain electrode placement surface in direct contact. The p-n column portion 19 is formed by alternately and adjacently an n-type semiconductor layer 15 and a p-type semiconductor layer 17 in one direction orthogonal to the direction of lamination of the $n^+$-type substrate 11 and the p-n column portion 19. (The above direction of lamination is vertical direction in the vertical element. It will be hereafter simply referred as the direction of lamination.) The n-type semiconductor layers 15 make a drift region of the vertical element. In the direction of juxtaposition of the n-type semiconductor layers 15 and the p-type semiconductor layers 17, an n-type semiconductor layer 15 makes an end semiconductor layer 15a. This end semiconductor layer 15a is smaller in impurity amount than the other n-type semiconductor layers 15 and its impurity amount is approximately ½ of the impurity amount of each of the n-type semiconductor layers 15.

The n-type semiconductor layers 15 are formed by vapor-phase diffusion after the formation of trenches. At this time, the n-type semiconductor layers 15 other than the end semiconductor layer 15a are formed by diffusing an n-type impurity in the regions between adjacent trenches in the semiconductor layers with the trenches formed therein from trench wall faces on both sides. Meanwhile, the end semiconductor layer 15a is not sandwiched between trenches, and is formed by diffusing an n-type impurity into a region in the vicinity of a trench adjacent to the trench. As mentioned above, when the end semiconductor layer 15a is formed, there is only one side available for the n-type impurity implantation. Therefore, when the n-type semiconductor layers 15 are formed by sufficiently diffusing an n-type impurity into the semiconductor layers between trenches, the following takes place: even after the formation of the n-type semiconductor layers 15, the impurity amount of the end semiconductor layer 15a is smaller than the impurity amount of each of the other n-type semiconductor layers 15 unless vapor-phase diffusion is intentionally continued. In other words, its width in the direction of juxtaposition is narrowed. This is described in JP-A-2006-173202 corresponding to US Patent Application Publication No. 2007-0238271. Ideally, therefore, the impurity amount of the end semiconductor layer 15a becomes approximately ½ of the impurity amount of each of the other n-type semiconductor layers 15. In the direction of juxtaposition, in other words, the width of the end semiconductor layer 15a becomes approximately ½ of the width of each of the other n-type semiconductor layers 15. An n-type impurity passes through a semiconductor layer between trenches from one trench wall face to the other trench wall face depending on the width of the semiconductor layer. This passage does not occur when the end semiconductor layer 15a is formed. Therefore, the impurity amount (width) of the end semiconductor layer 15a becomes slightly larger than ½ of the impurity amount (width) of each of the other n-type semiconductor layers 15. When vapor-phase diffusion is intentionally continued even after the n-type impurity is sufficiently diffused and the n-type semiconductor layers 15 are formed, the following takes place: the impurity amount (width) of the end semiconductor layer 15a becomes larger than ½ of the impurity amount (width) of each of the other n-type semiconductor layers 15. In cases where the semiconductor layers between trenches are large in width, an n-type impurity is not sufficiently diffused, and the semiconductor layers are of three-layer structure in the direction of juxtaposition, the following measure is taken: the n-type semiconductor layers with the n-type impurity diffused at both ends are taken as the n-type semiconductor layer 15, and these n-type semiconductor layers 15 and the end semiconductor layer 15a are compared with each other. Of the regions of the semiconductor layers in the vicinity of trenches adjacent to the trenches, the portions other than the end semiconductor layer 15a make the $n^-$-type semiconductor layer 21.

Any construction can be adopted for the n-type semiconductor layers 15 and the p-type semiconductor layers 17 as long as the following can be implemented: they are drift regions in which a current passes through the n-type semiconductor layers 15 in on state; in off state, depletion layers are expanded from the individual p-n junctions in the p-n column portion 19 in the direction perpendicular to the direction of lamination (lateral direction); and thus the entire p-n column portion 19 can be depleted and a desired breakdown voltage can be ensured. For example, the width of each layer can be set to 0.5 to 5 μm, the thickness in the direction of lamination can be set to 5 to 100 μm, and the impurity concentration can be set to $1 \times 10^{15}$ cm$^{-3}$ to $5 \times 10^{16}$ cm$^{-3}$. This embodiment is characterized in the structure of part of the p-type semiconductor layers 17 constructing the p-n column portion 19. This characteristic portion will be described later.

On the surface of the $n^+$-type substrate 11 on the opposite side to the drain electrode placement surface, the $n^-$-type semiconductor layer 21 is disposed in direct contact in the direction perpendicular to the direction of lamination (lateral direction). The $n^-$-type semiconductor layer is disposed so that it adjoins the p-n column portion 19. Specifically, it is disposed not only in the direction of juxtaposition but also in the direction orthogonal to the direction of juxtaposition (direction of the length of each semiconductor layer 15, 17). The p-n column portion 19 is encircled with the n-type semiconductor layer 21. For the $n^-$-type semiconductor layer 21, the following construction can be adopted: the thickness in the direction of lamination is substantially equal to that of the p-n column portion 19 (appropriately set according to a required breakdown voltage); and the impurity concentration is lower than that of the n-type semiconductor layers 15, for example, $1 \times 10^{14}$ cm$^{-3}$ to $1 \times 10^{15}$ cm$^{-3}$. Thus, in off state, depletion layers are widely expanded in the direction of juxtaposition in the $n^-$-type semiconductor layer 21; and in the peripheral portion 25, a sufficient electric potential difference can be held in the direction of juxtaposition. Therefore, the breakdown voltage of the peripheral portion 25 is determined by the width of the depletion layers formed in the vertical direction. However, when the n-well 43 electrically connected with the $n^+$-type substrate 11 through the $n^-$-type semiconductor layer 21 is formed as in this embodiment, the following takes place: the distance from an end of the field plate 29a to the n-well 43 also has influence on breakdown voltage. Therefore, the length of the $n^-$-type semiconductor layer 21 in the direction of juxtaposition can be set so that the following is implemented: the distance from the end of the field plate 29a to the n-well 43 in the direction of juxtaposition becomes such a distance that a desired breakdown voltage can be ensured. The length can be set to, for example, 20 μm to 200 μm according to a required breakdown voltage.

On the surfaces of the p-n column portion 19 and the $n^-$-type semiconductor layer 21 on the opposite side to the n+-type substrate 11, the p−-type semiconductor layer 23 is formed in direct contact. The p−-type semiconductor layer is so formed that it is extended astride the p-n column portion 19 and the n−-type semiconductor layer 21. In the peripheral portion 25, a depletion layer is also formed in the p−-type semiconductor layer 23. Therefore, the length in the direction of lamination by which a depletion layer can be formed in the peripheral portion 25 can be set to a length obtained by adding those of the n−-type semiconductor layer 21 and the p−-type semiconductor layer 23. Further, the following can be implemented since a depletion layer can be extended into the n−-type semiconductor layer 21 from a junction between the p−-type semiconductor layer 23 and the n−-type semiconductor layer 21: it is possible to facilitate the extension of the depletion layer in the n−-type semiconductor layer 21 in the direction perpendicular to the direction of lamination (lateral direction). For the p−-type semiconductor layer 23, the following construction can be adopted: the thickness in the direction of lamination is 0.2 μm to 10 μm or so; and the impurity concentration is higher than that of the n−-type semiconductor layer 21, for example, $1 \times 10^{15}$ cm$^{-3}$ to $3 \times 10^{16}$ cm$^{-3}$.

On the surface of the peripheral portion 25 in the p−-type semiconductor layer 23, the field oxide film 27, for example, 1 μm to 3 μm in thickness is formed in direct contact. The field plate 29a is disposed as part of the source electrode 29 over the surface of the field oxide film 27 at least on the p-n column portion 19 side. This field plate 29a makes it possible to mitigate electric field concentration at corners (areas having high curvature) of the outermost base contact region 35a and the base region 31. There is no special limitation on the length of the field plate 29a in the direction of juxtaposition. It only has to be most suitable for relaxing the electric field on the surface side (source electrode 29 side). However, when the n-well 43 is provided, as mentioned above, the distance from the n-well 43 must be increased with increase in required breakdown voltage. For example, the length of the field plate 29a in the direction of juxtaposition can be set to a value equal to or smaller than ½ of the length from the boundary with the p-n column portion 19 to the n-well 43.

On the portion of the p−-type semiconductor layer 23 above the p-n column portion 19, a p-type base region 31 is formed in direct contact. In the surficial layer of the base region 31, n+-type source regions 33 and p+-type base contact regions 35 are selectively formed. The source regions 33 and the base contact regions 35 are electrically connected with the source electrode 29. A trench gate electrode 37 is formed so that it penetrates the base region 31 and the p−-type semiconductor layer 23 separating the source regions 33 and the n-type semiconductor layers 15 from each other. This trench gate electrode 37 is covered with a gate insulating film 39. The source electrode 29 and the trench gate electrode 37 are electrically isolated from each other by an interlayer insulating film 41.

Description will be given to a characteristic portion of the semiconductor device 100 in this embodiment. In this embodiment, all the p-type semiconductor layers 17 are made equal in impurity concentration. Of the p-type semiconductor layers 17 constructing the p-n column portion 19, the p-type semiconductor layer 17a adjoining the end semiconductor layer 15a in the direction of juxtaposition is so formed that the following is implemented: its width is larger than the width of the other p-type semiconductor layers 17. (The above p-type semiconductor layer 17a is the outermost one of the p-type semiconductor layers 17 in the direction of juxtaposition.) That is, the impurity amount of the p-type semiconductor layer 17a is larger than that of each of the other p-type semiconductor layers 17. In this embodiment, as mentioned above, the semiconductor device 100 with the n-type semiconductor layers 15 formed by vapor-phase diffusion is so constructed that the following is implemented: of the semiconductor layers 15, 17 constructing the p-n column portion 19, the following layer is larger in impurity amount than conventional: a p-type semiconductor layer 17 that is different in conductivity type from the n−-type semiconductor layer 21 adjoining the p-n column portion 19 and is positioned in the outermost periphery. This makes it possible to use part of the impurity of the outermost p-type semiconductor layer 17a to ensure a charge balance between it and the n−-type semiconductor layer 21. Therefore, a depletion layer is more easily extended in the n−-type semiconductor layer 21 in the direction perpendicular to the direction of lamination (lateral direction). As a result, it is possible to enhance the breakdown voltage of the peripheral portion 25 more than the related art and thus enhance the breakdown voltage of the entire semiconductor device 100.

The impurity amount of the outermost p-type semiconductor layer 17a is controlled by width, not by impurity concentration. Therefore, local ion implantation or the like is not necessary and the manufacturing process can be simplified.

In this embodiment, as illustrated in FIG. 6, the following measure is taken with respect to the impurity amount of the p-type semiconductor layer 17a: the n-type semiconductor layer 15b adjoining the outermost p-type semiconductor layer 17a on the opposite side to the end semiconductor layer 15a in the direction of juxtaposition is divided into two by a median VIA (indicated by broken line) in the direction of length; the total impurity amount of the n-type semiconductor layers 15 positioned between the median and the end semiconductor layer 15a (the side indicated by arrow) and the impurity amount of the n−-type semiconductor layer 21 positioned on the end semiconductor layer 15a side are added (The above n-type semiconductor layers are equivalent to half of the n-type semiconductor layer 15b and the end semiconductor layer 15a.); and the impurity amount of the p-type semiconductor layer 17a is equal to or smaller than this added impurity amount. The n−-type semiconductor layer 21 positioned on the end semiconductor layer 15a side refers to not only a region parallel with the p-n column portion 19 in the direction of juxtaposition. It also includes a region positioned in the direction of length and a cross region (corner region) in the direction of juxtaposition and in the direction of length. Therefore, the p-type semiconductor layer 17a large in impurity amount is provided and yet the following can be implemented: it is possible to suppress abrupt change in impurity amount between it and the portion between the broken line and the center in the direction of juxtaposition to smooth an electric potential distribution when the vertical element is off. That is, the breakdown voltage of the semiconductor device 100 can be further enhanced.

The p-type semiconductor layers 17 other than the outermost p-type semiconductor layer 17a only have to have such a construction that the following is implemented: at least a charge balance is ensured between them and the respective halves of the two adjacent n-type semiconductor layers 15 in the direction of juxtaposition. Thus, the breakdown voltage of the p-n column portion 19 can be ensured. However, the n−-type semiconductor layer 21 and the end semiconductor layer 15a positioned in the direction of length may be taken into account. For example, the following measure may be taken in the range VIB indicated by alternate long and short dash line in FIG. 6: the impurity amount of one p-type semiconductor layer 17 is made larger than the total impurity amount of the respective halves of the two adjacent n-type semiconductor layers 15 in the direction of juxtaposition; and at the same time, its impurity amount is made equal to or smaller than the following sum: the sum obtained by adding the total impurity amount of the respective halves of the two adjacent n-type semiconductor layers 15, the impurity amount of the end semiconductor layer 15a positioned in the direction of length, and the impurity amount of the n⁻-type semiconductor layer 21 positioned in the direction of length. This makes it possible to enhance the breakdown voltage of the peripheral portion 25 also in the direction of length and thus enhance the breakdown voltage of the entire semiconductor device 100.

Figure 7:
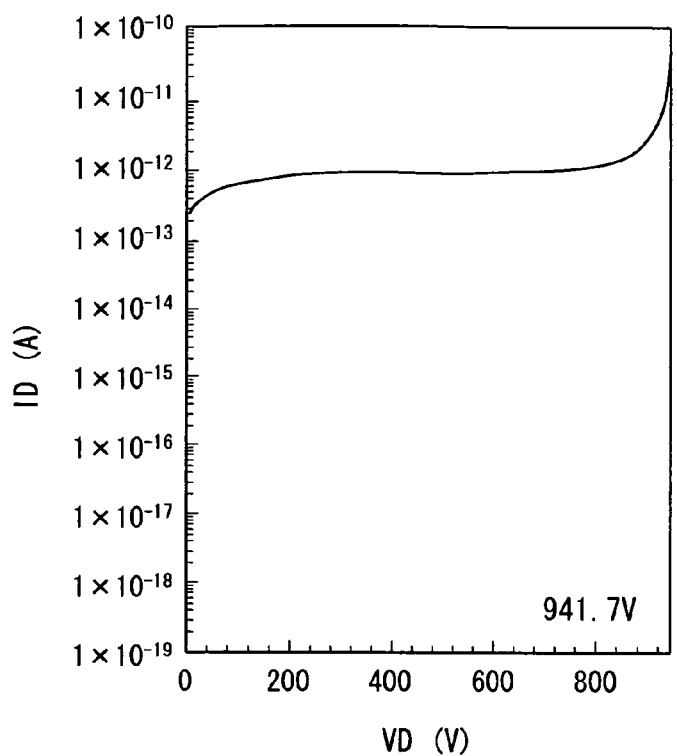
FIG. 7 is a drawing illustrating the relation between drain-source voltage and drain current.
Figure 8:
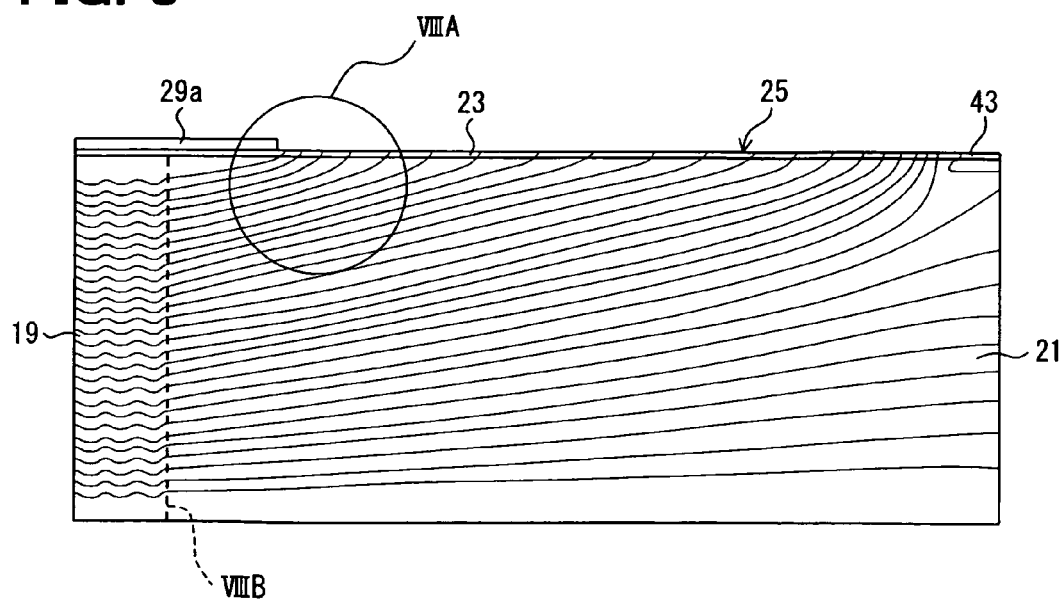
FIG. 8 is a drawing illustrating an electric potential distribution at the time of breakdown.

The present inventors verify the above mentioned effect by simulation. FIG. 7 and FIG. 8 illustrate the result of the verification. FIG. 7 illustrates the relation between drain-source voltage and drain current. FIG. 8 illustrates an electric potential distribution at the time of breakdown. In FIG. 8, the boundary VIIIB between the p-n column portion 19 and the n⁻-type semiconductor layer 21 is indicated by broken line. For the simulation, the width of the outermost p-type semiconductor layer 17a is made larger by 15% than the width of each of the other p-type semiconductor layers 17. The other conditions are the same as for the simulation the result of which is illustrated in FIG. 3 and FIG. 4.

As illustrated in FIG. 7, the result of the simulation revealed that a breakdown voltage of approximately 942V could be ensured as compared with the target breakdown voltage (900V or above). As illustrated in FIG. 8, it is revealed that electric field concentration is mitigated at a region VIIIA under the end of the field plate 29a as compared with the comparison cases. (Refer to FIG. 4.) A breakdown occurs in the surficial layer of the boundary between the p⁻-type semiconductor layer 23 and the n-well 43 in the peripheral portion 25. Therefore, the breakdown voltage can be further enhanced by increasing the distance from the end semiconductor layer 15a to the n-well 43 (in other words, the distance between the field plate 29a and the n-well 43). As mentioned above, the following is revealed also by the result of the simulation: the breakdown voltage can be enhanced by making the impurity amount of the outermost p-type semiconductor layer 17a larger than those of the other p-type semiconductor layers 17.

Figure 9:
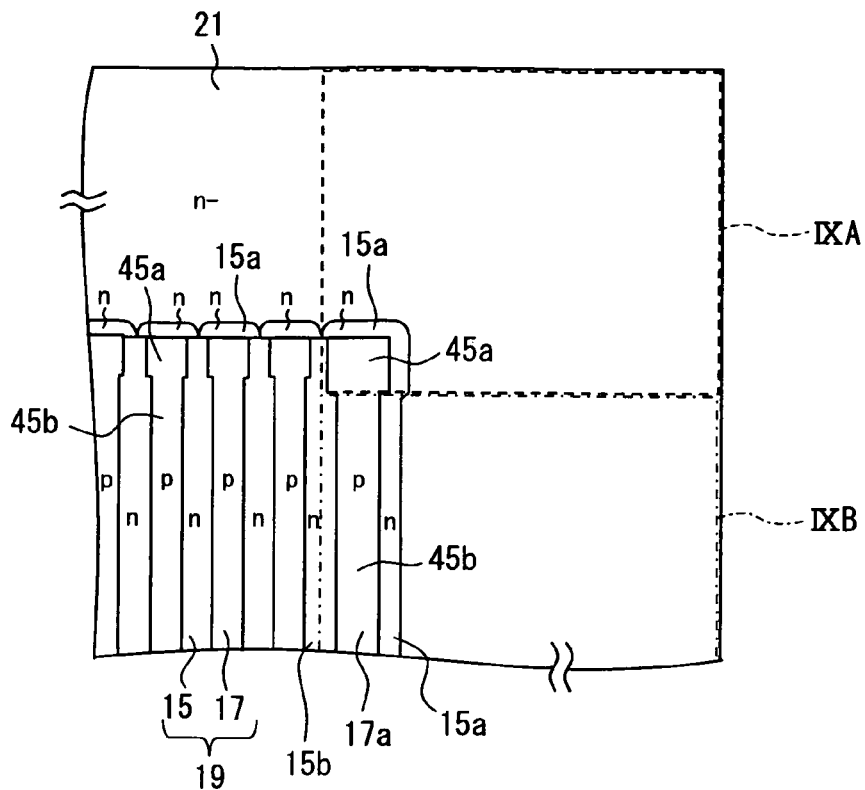
FIG. 9 is a sectional view illustrating a semiconductor device according to a first modification.
Figure 10:
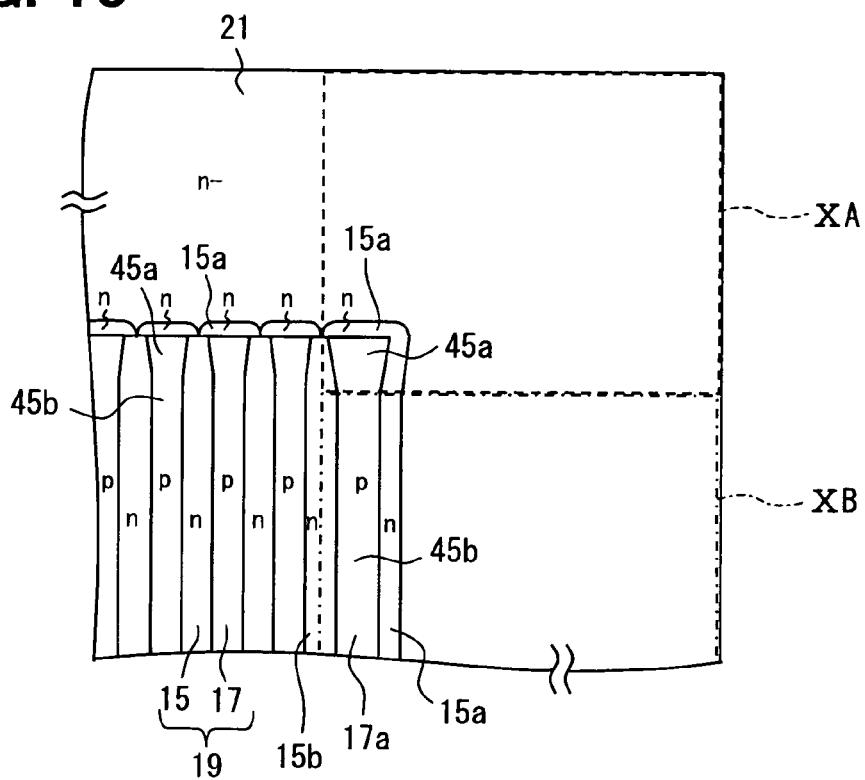
FIG. 10 is a sectional view illustrating a semiconductor device according to a second modification.

In the description of this embodiment, a case where the width of each of the semiconductor layers 15, 17 constructing the p-n column portion 19 is fixed in the direction of length has been taken as an example. In this case, the pattern of each semiconductor layer 15, 17 is simple; therefore, burying failure and the like can be suppressed when the p-type semiconductor layers 17 are formed in trenches. However, a construction that the width is not fixed may be adopted. As illustrated in FIG. 9 and FIG. 10, for example, the p-type semiconductor layers 17 may be so constructed that the width of their ends 45a in the direction of length is larger than the width of the midportions 45b between the ends 45a. This makes it possible to further increase the impurity amount contributing to a charge balance between them and the n⁻-type semiconductor layer 21 and the end semiconductor layer 15a positioned in the direction of length. FIG. 9 and FIG. 10 are sectional views illustrating modifications and correspond to FIG. 6.

In FIG. 9, for example, the ends 45a are in a rectangular shape. Instead, they may be formed in such a shape that their width is gradually increased from the midportion 45b side as illustrated in FIG. 10. ("Gradually" may be continuously or stepwise. FIG. 10 illustrates a case of continuous increase.) (In other words, the impurity amount is gradually increased from the midportion 45b side.) In this case, an electric potential distribution in off state is smoothed in the direction of length and the breakdown voltage can be further enhanced.

In the examples illustrated in FIG. 9 and FIG. 10, every p-type semiconductor layer 17 has the ends 45a and the midportion 45b. Instead, the invention may be so constructed that only the outermost p-type semiconductor layer 17a has the ends 45a and the midportion 45b. The outermost p-type semiconductor layer 17a attains a charge balance with the n⁻-type semiconductor layer 21 not only in a region in the direction of length. In also attains a charge balance in a region in the direction of juxtaposition and a cross region (corner region) in the direction of juxtaposition and in the direction of length. Therefore, it is presumed that the effect of breakdown voltage enhancement by widening the ends 45a will be most remarkably produced.

When the ends 45a and the midportions 45b are provided, the regions with which a charge balance is attained may be divided by the ends 45a and the midportions 45b, as illustrated in FIG. 9 and FIG. 10, when designing a charge balance. That is, with respect to the region IXB, XB (bounded by alternate long and short dash line) of the n⁻-type semiconductor layer 21 parallel with the midportion 45b in the direction of juxtaposition, a charge balance is attained at the midportion 45b; and with respect to the other region IXA, XA (bounded by broken line), a charge balance is attained at the ends 45a. Also, with respect to the p-type semiconductor layers 17 other than the outermost p-type semiconductor layer 17a, the regions with which a charge balance is attained may be divided by the ends 45a and the midportions 45b when designing a charge balance.

In the description of this embodiment, the following case has been taken as an example: a case where the width of the outermost p-type semiconductor layer 17a is made larger than the width of each of the other p-type semiconductor layers 17 and its impurity amount is thereby made larger than the impurity amount of each of the other p-type semiconductor layers 17. Instead, the invention may be so constructed that the following is implemented: the width of every p-type semiconductor layer 17 is fixed; the impurity concentration of the outermost p-type semiconductor layer 17a is made higher (denser) than the impurity concentration of each of the other p-type semiconductor layers 17; and its impurity amount is thereby made larger than the impurity amount of each of the other p-type semiconductor layers 17. Or, the impurity amount of the outermost p-type semiconductor layer 17a may be made larger than the impurity amount of each of the other p-type semiconductor layers 17 by width and impurity concentration.

In the description of this embodiment, a semiconductor device 100 with an n-channel MOSFET incorporated has been taken as an example. However, also in a semiconductor device with a p-channel MOSFET incorporated (construction with the conductivity type switched between p and n), the same or equivalent effect can be expected by applying the above-mentioned constructions.

In the description of this embodiment, a case where an n-well 43 is provided has been taken as an example. Instead, the invention may be constructed without the n-well 43.

Second Embodiment

Figure 11:
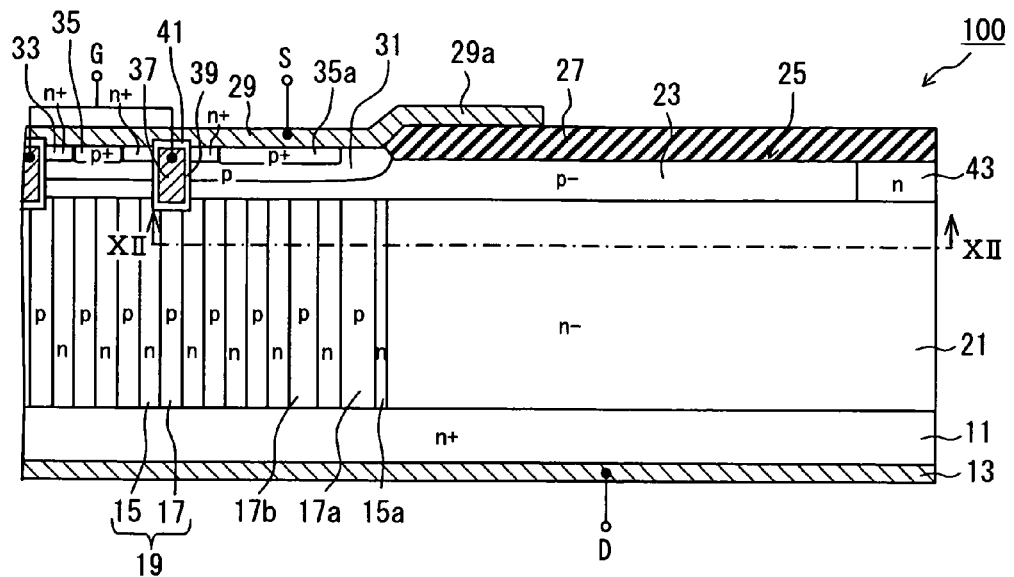
FIG. 11 is a sectional view illustrating the general configuration of a semiconductor device in a second embodiment.
Figure 12:
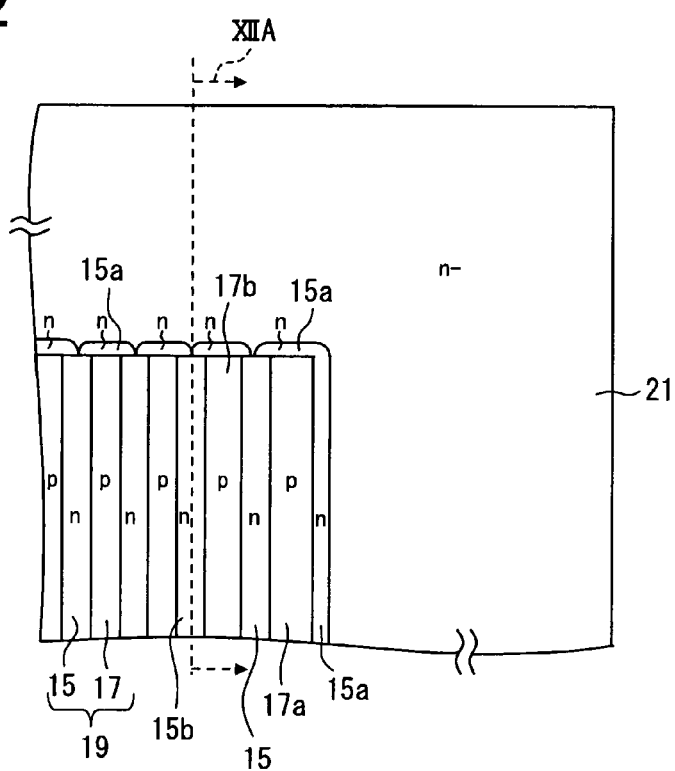
FIG. 12 is a sectional view taken along line XII-XII of FIG. 11.

FIG. 11 is a sectional view illustrating the general configuration of a semiconductor device in a second embodiment. FIG. 12 is a sectional view taken along line XII-XII of FIG. 11. The same elements as components illustrated in FIG. 1 and FIG. 2 or described in relation to the first embodiment will be marked with the same reference numerals.

The semiconductor device in this embodiment is identical with the semiconductor device 100 in the first embodiment in basic configuration, and is different in that it has multiple p-type semiconductor layers 17 larger in impurity amount.

As illustrated in FIG. 11 and FIG. 12, the semiconductor device 100 in this embodiment has the following as a semiconductor layer larger in impurity amount than the other p-type semiconductor layers 17: in addition to the outermost p-type semiconductor layer 17a in the first embodiment, it has the p-type semiconductor layer 17b adjacent to the p-type semiconductor layer 17a. That is, of the p-type semiconductor layers 17, multiple p-type semiconductor layers 17a, 17b counted from the end semiconductor layer 15a side are larger in impurity amount than the other p-type semiconductor layers 17. More specific description will be given. The impurity concentration of every p-type impurity layer 17 is substantially fixed, and the width of each of the p-type semiconductor layers 17a, 17b is larger than the width of each of the other p-type semiconductor layers 17 as illustrated in FIG. 11 and FIG. 12.

With this construction, as illustrated in FIG. 12, the following measure is taken with respect to the total impurity amount of the p-type semiconductor layers 17a, 17b: of the p-type semiconductor layers 17a, 17b, the p-type semiconductor layer 17b is the one farther from the end semiconductor layer 15a in the direction of juxtaposition; the n-type semiconductor layer 15b adjoining the p-type semiconductor layer 17b on the opposite side to the end semiconductor layer 15a is divided into two by a median XIIA (indicated by broken line) in the direction of length; the total impurity amount of the n-type semiconductor layers 15 positioned between the median and the end semiconductor layer 15a (the side indicted by arrow) and the impurity amount of the $n^-$-type semiconductor layer 21 positioned on the end semiconductor layer 15a side are added (The above n-type semiconductor layers are equivalent to half of the n-type semiconductor layer 15b, an n-type semiconductor layer 15, and the end semiconductor layer 15a.); and the total impurity amount of the p-type semiconductor layers 17a, 17b is made equal to or smaller than this added impurity amount. Therefore, the p-type semiconductor layer 17a large in impurity amount is provided and yet the following can be implemented: it is possible to suppress abrupt change in impurity amount between it and the portion between the broken line and the center in the direction of juxtaposition to smooth an electric potential distribution when the vertical element is off. That is, the breakdown voltage of the semiconductor device 100 can be further enhanced. In this embodiment, especially, the multiple p-type semiconductor layers 17a, 17b large in impurity amount are provided as illustrated in FIG. 11 and FIG. 12. That is, they are so provided that the impurity amount is gradually increased as it goes from the other p-type semiconductor layer 17 side toward the end semiconductor layer 15a. Therefore, an electric potential distribution in off state can be further smoothed in the direction of juxtaposition, and thus the breakdown voltage of the semiconductor device 100 can be further enhanced. However, the invention may be so constructed that the p-type semiconductor layers 17a, 17b are equal in impurity amount to each other.

In the description of this embodiment, a case where two p-type semiconductor layers 17a, 17b are provided as semiconductor layers larger in impurity amount than the other p-type semiconductor layers 17 has been taken as an example. However, the number of the semiconductor layers need not be two and may be three or more. Even when three or more semiconductor layers are provided, an electric potential distribution in off state is made smoother by providing them so that the impurity amount is gradually increased as it goes toward the end semiconductor layer 15a.

Figure 13:
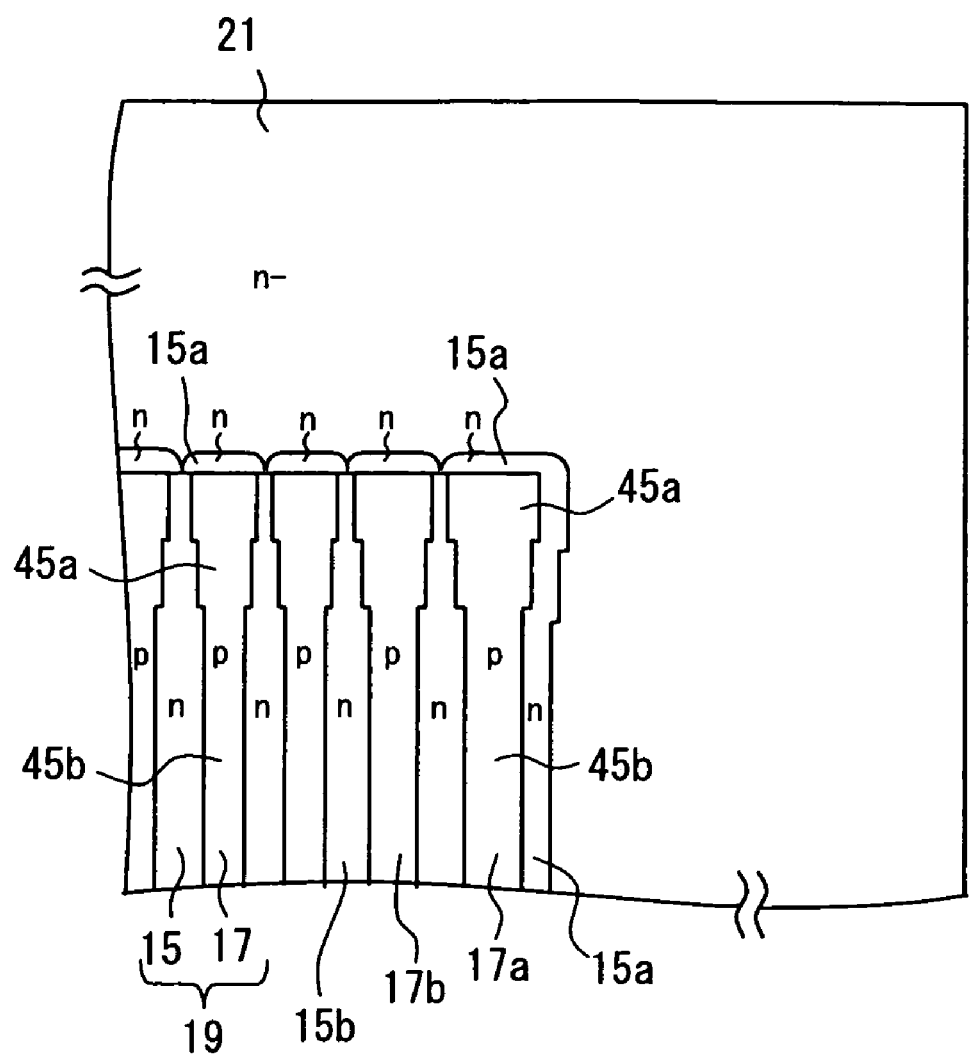
FIG. 13 is a sectional view illustrating a semiconductor device according to a first modification of the second embodiment.

Also, in the description of this embodiment, a case where the width of each of the semiconductor layers 15, 17 constructing the p-n column portion 19 is fixed in the direction of length as illustrated in FIG. 12 has been taken as an example. However, a construction that the width is not fixed as illustrated as a modification to the first embodiment may be adopted. That is, a construction that ends 45a and midportions 45b are provided may be adopted. In this embodiment, the multiple p-type semiconductor layers 17a, 17b larger in impurity amount than the other p-type semiconductor layers 17 are provided and the impurity amount of the p-type semiconductor layers 17a, 17b is gradually increased toward the end semiconductor layer 15a. In this case, for example, the ends 45a may be constructed stepwise according to the number of the p-type semiconductor layers 17a, 17b large in impurity amount. In FIG. 13, for example, the width of each end 45a is also gradually increased toward the end semiconductor layer 15a in the direction of juxtaposition. Further, the width of each end 45a is increased stepwise so that the impurity amount is increased as it goes from the midportion 45b toward the $n^-$-type semiconductor layer 21 in the direction of length. Specifically, each end 45a is constructed in two steps in correspondence to the two p-type semiconductor layers 17a, 17b. With this construction, an electric potential distribution in off state becomes smoother in the direction of length and thus the breakdown voltage can be further enhanced. FIG. 13 is a sectional view illustrating a modification.

Also, in the description of this embodiment, a case where the impurity amount is adjusted by width has been taken as an example. However, the impurity amount may be adjusted by impurity concentration. Or, the impurity amount may be adjusted by width and impurity concentration.

Also, in the description of this embodiment, a semiconductor device 100 with an n-channel MOSFET incorporated has been taken as an example. However, also in a semiconductor device with a p-channel MOSFET incorporated (construction with the conductivity type switched between p and n), the same or equivalent effect can be expected by applying the above-mentioned constructions.

In the description of this embodiment, a case where an n-well 43 is provided has been taken as an example. Instead, the invention may be constructed without the n-well 43.

Third Embodiment

Figure 14:
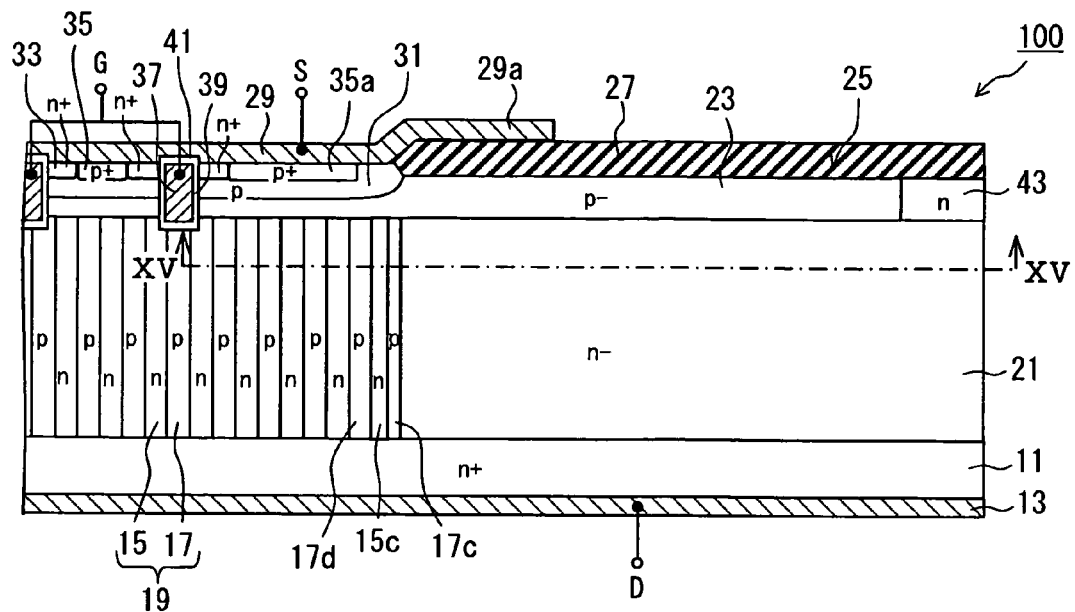
FIG. 14 is a sectional view illustrating the general configuration of a semiconductor device in a third embodiment.
Figure 15:
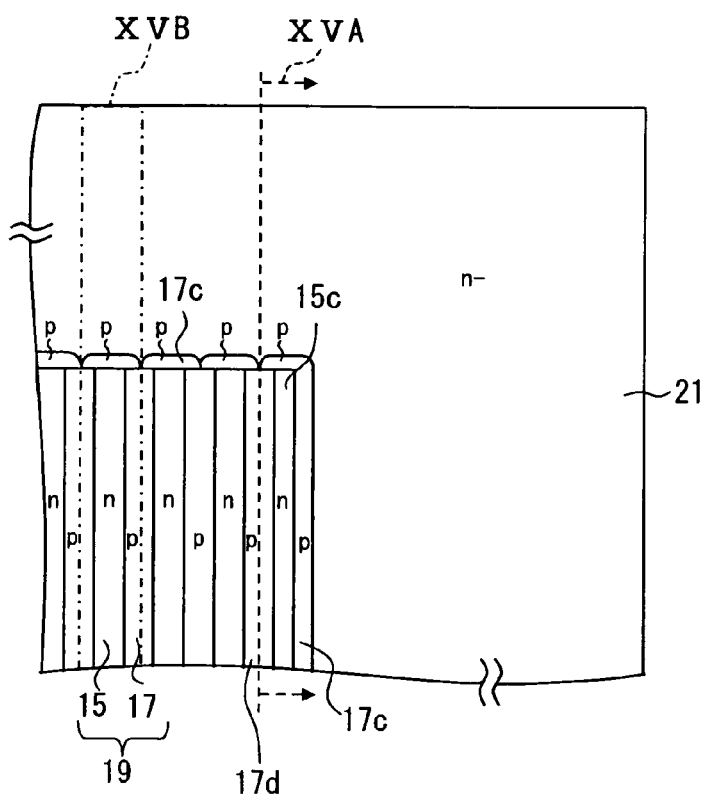
FIG. 15 is a sectional view taken along line XV-XV of FIG. 14.

FIG. 14 is a sectional view illustrating the general configuration of a semiconductor device in a third embodiment. FIG. 15 is a sectional view taken along line XV-XV of FIG. 14. The same elements as components illustrated in FIG. 1 and FIG. 2 or described in relation to the first embodiment or the second embodiment will be marked with the same reference numerals.

The semiconductor device in this embodiment is identical with the semiconductor device 100 in the first embodiment in basic configuration and is different in the following point: a p-type semiconductor layer 17 is taken as the end semiconductor layer of the p-n column portion 19; and some of the n-type semiconductor layers 15 counted from the end semiconductor layer side are smaller in impurity amount than the other n-type semiconductor layers 15. The semiconductor device 100 of this construction can be formed, for example, by the following procedure: trenches are formed in an $n^-$-type semiconductor layer; thereafter, a p-type impurity is diffused by vapor-phase diffusion (e.g., $B_2H_6$) to form the p-type semiconductor layers 17; and an n-type semiconductor layer is buried and formed in the trenches by epitaxial growth.

In the semiconductor device 100 in this embodiment, as illustrated in FIG. 14 and FIG. 15, one of the p-type semiconductor layers 17 is the end semiconductor layer 17c of the p-n column portion 19. More specific description will be given. Similarly with the end semiconductor layer 15a in the first embodiment, the following is implemented: the impurity amount (width) of the end semiconductor layer 17c is made equal to approximately ½ of the impurity amount (width) of each of the other semiconductor layers 17 of the same conductivity type because of the influence of vapor-phase diffusion. All the p-type semiconductor layers 17 are substantially equal in impurity concentration and the impurity amount of the end semiconductor layer 17c is smaller than that of each of the other p-type semiconductor layers 17. That is, the end semiconductor layer 17c that should attain a charge balance with the n$^-$-type semiconductor layer 21 in the peripheral portion 25 is reduced.

In this embodiment, consequently, the impurity amount of the n-type semiconductor layer 15c (the outermost one of the n-type semiconductor layers 15) adjoining the end semiconductor layer 17c is made smaller than that of each of the other n-type semiconductor layers 15. Specifically, all the n-type semiconductor layers 15 are made substantially equal in impurity concentration and the width of the outermost n-type semiconductor layer 15c is made smaller than that of each of the other n-type semiconductor layers 15. Thus, at least part of the impurity in the end semiconductor layer 17c adjoining the n$^-$-type semiconductor layer 21 can be used for ensuring a charge balance between it and the n$^-$-type semiconductor layer 21. Therefore, a depletion layer is more easily extended in the n$^-$-type semiconductor layer 21 in the direction perpendicular to the direction of lamination (lateral direction). As a result, it is possible to enhance the breakdown voltage of the peripheral portion 25 more than conventional and thus enhance the breakdown voltage of the semiconductor device 100.

The impurity amount of the outermost n-type semiconductor layer 15c is controlled by width, not by impurity concentration. Therefore, local ion implantation or the like is not necessary and the manufacturing process can be simplified.

In this embodiment, as illustrated in FIG. 15, the following measure is taken with respect to the impurity amount of the outermost n-type semiconductor layer 15c: the p-type semiconductor layer 17d adjoining the n-type semiconductor layer 15c on the opposite side to the end semiconductor layer 17c in the direction of juxtaposition is divided into two by a median XVA (indicated by broken line) in the direction of length; the difference between the total impurity amount of the p-type semiconductor layers 17 positioned between the median and the end semiconductor layer 17c (the side indicated by arrow) and the impurity amount of the n$^-$-type semiconductor layer 21 positioned on the end semiconductor layer 17c is determined (The above p-type semiconductor layers are equivalent to half of the p-type semiconductor layer 17d and the end semiconductor layer 17c); and the above impurity amount of the outermost n-type semiconductor layer 15c is made equal to or larger than this difference. Therefore, the n-type semiconductor layer 15c small in impurity amount is provided and yet the following can be implemented: it is possible to suppress abrupt change in impurity amount between it and the portion between the broken line and the center in the direction of juxtaposition to smooth an electric potential distribution when the vertical element is off. That is, the breakdown voltage of the semiconductor device 100 can be further enhanced.

The n-type semiconductor layers 15 other than the outermost n-type semiconductor layer 15c only have to have such a construction that the following is implemented: at least a charge balance is ensured between them and the respective halves of the two adjacent p-type semiconductor layers 17 in the direction of juxtaposition. Thus, the breakdown voltage of the p-n column portion 19 can be ensured. However, the n$^-$-type semiconductor layer 21 and the end semiconductor layer 17c positioned in the direction of length may be taken into account. For example, the impurity amount of one n-type semiconductor layer 15 may be made equal to or larger than the difference between XVC and XVD in the range XVB indicated by alternate long and short dash line in FIG. 15. XVC is the sum of the total impurity amount of the respective halves of the two adjacent p-type semiconductor layers 17 and the impurity amount of the end semiconductor layer 17c positioned in the direction of length. XVD is the impurity amount of the n$^-$-type semiconductor layer 21 positioned in the direction of length. This makes it possible to smooth an electric potential distribution in off state also in the direction of length and further enhance the breakdown voltage.

Figure 16:
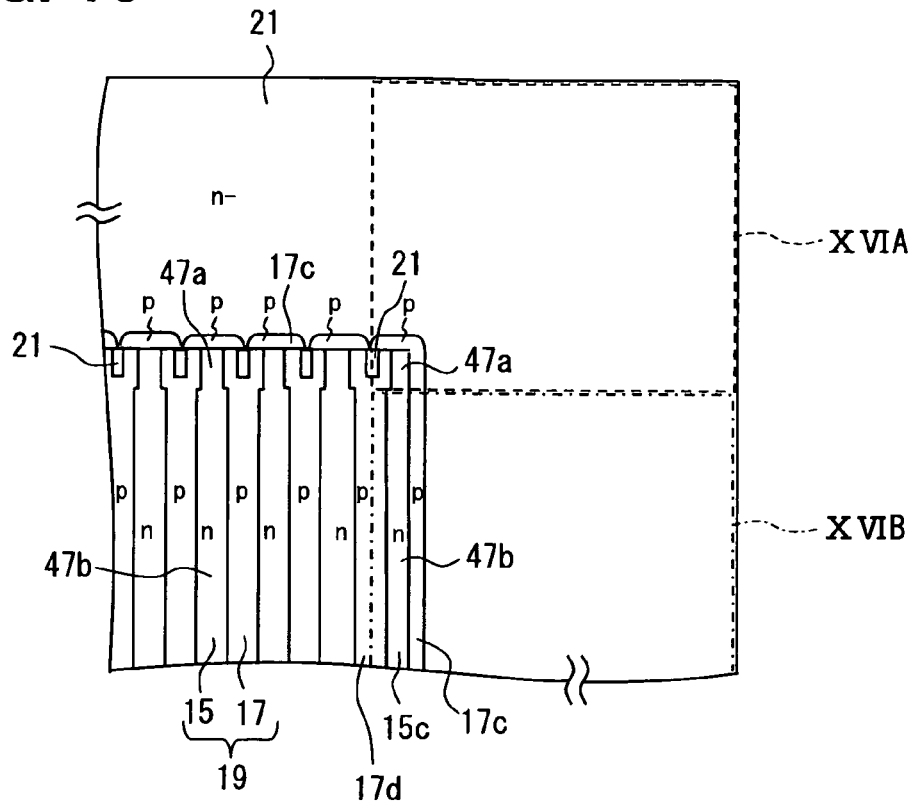
FIG. 16 is a sectional view illustrating a semiconductor device according to a first modification of the third embodiment.
Figure 17:
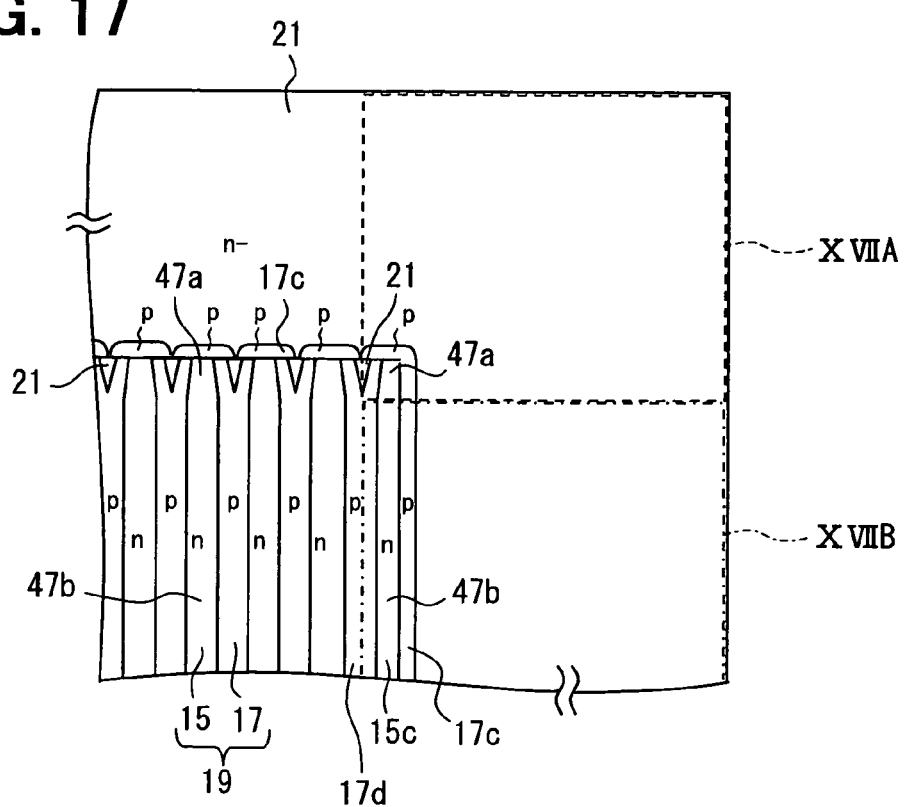
FIG. 17 is a sectional view illustrating a semiconductor device according to a second modification of the third embodiment.

Also, in the description of this embodiment, a case where the width of each semiconductor layer 15, 17 constructing the p-n column portion 19 is fixed in the direction of length has been taken as an example. However, a construction that the width is not fixed may be adopted. As illustrated in FIG. 16 and FIG. 17, for example, the n-type semiconductor layers 15 may be so constructed that the width of their ends 47a in the direction of length is smaller than the width of the midportions 47b between the ends 47a. This makes it possible to further reduce the n-type impurity amount contributing to a charge balance in the direction of length. As a result, a charge balance can be ensured in the direction of length with the n$^-$-type semiconductor layer 21 included. FIG. 16 and FIG. 17 are sectional views illustrating modifications and correspond to FIG. 15.

In FIG. 16, for example, the ends 47a are in a rectangular shape. Instead, they may be formed in such a shape that their width is gradually reduced from the midportion 47b as illustrated in FIG. 17. ("Gradually" may be continuously or stepwise. FIG. 17 illustrates a case of continuous reduction.) (In other words, the impurity amount is gradually varied from the midportion 47b.) In this case, an electric potential distribution in off state is smoothed and the breakdown voltage can be further enhanced.

In the examples illustrated in FIG. 16 and FIG. 17, every n-type semiconductor layer 15 has the ends 47a and the midportion 47b. Instead, the invention may be so constructed that only the outermost n-type semiconductor layer 15c has the ends 47a and the midportion 47b. Similarly with the modifications to the first embodiment, it is presumed that the effect of breakdown voltage enhancement by narrowing the ends 47a will be most remarkably produced.

When the ends 47a and the midportions 47b are provided, regions may be divided, for example, as illustrated in FIG. 16 and FIG. 17, when designing a charge balance. That is, regions are divided into: a region XVIB, XVIIB parallel with the midportion 47b in the direction of juxtaposition (the region within the range bounded by alternate long and short dash line); and the other region XVIA, XVIIA (the region within the range, including the end 47a, bounded by broken line). Also, with respect to the n-type semiconductor layers 15 other than the outermost n-type semiconductor layer 15c, the regions with which a charge balance is attained may be divided by the ends 47a and the midportions 47b when designing a charge balance.

In the description of this embodiment, the following case has been taken as an example: a case where the width of the outermost n-type semiconductor layer 15c is made smaller than the width of each of the other n-type semiconductor layers 15 and its impurity amount is thereby made smaller than the impurity amount of each of the other n-type semiconductor layers 15. Instead, the invention may be so constructed that the following is implemented: the width of every n-type semiconductor layer 15 is fixed; the impurity concentration of the outermost n-type semiconductor layer 15c is made lower than the impurity concentration of each of the other n-type semiconductor layers 15; and its impurity amount is thereby made larger than the impurity amount of each of the other n-type semiconductor layers 15. Or, the impurity amount of the outermost n-type semiconductor layer 15c may be made smaller than the impurity amount of each of the other n-type semiconductor layers 15 by width and impurity concentration.

In the description of this embodiment, a case where a semiconductor layer smaller in impurity amount than the other n-type semiconductor layers 15 is only the outermost n-type semiconductor layer 15c has bee taken as an example. However, as described in relation to the p-type semiconductor layers 17 in the second embodiment, multiple n-type semiconductor layers 15 counted from the end semiconductor layer 17c side in the direction of juxtaposition may be taken as semiconductor layers smaller in impurity amount. In this case, an electric potential distribution in off state can be further smoothed by gradually (continuously or stepwise) reducing the impurity amount toward the end semiconductor layer 17c. As described in relation to the modification to the second embodiment, the ends 47a may be so constructed that they are also reduced stepwise in width toward the n⁻-type semiconductor layer 21 in the direction of length.

In the description of this embodiment, a semiconductor device 100 with an n-channel MOSFET incorporated has been taken as an example. However, also in a semiconductor device with a p-channel MOSFET incorporated (construction with the conductivity type switched between p and n), the same or equivalent effect can be expected by applying the above-mentioned constructions.

In the description of this embodiment, a case where an n-well 43 is provided has been taken as an example. Instead, the invention may be constructed without the n-well 43.

Fourth Embodiment

Figure 18:
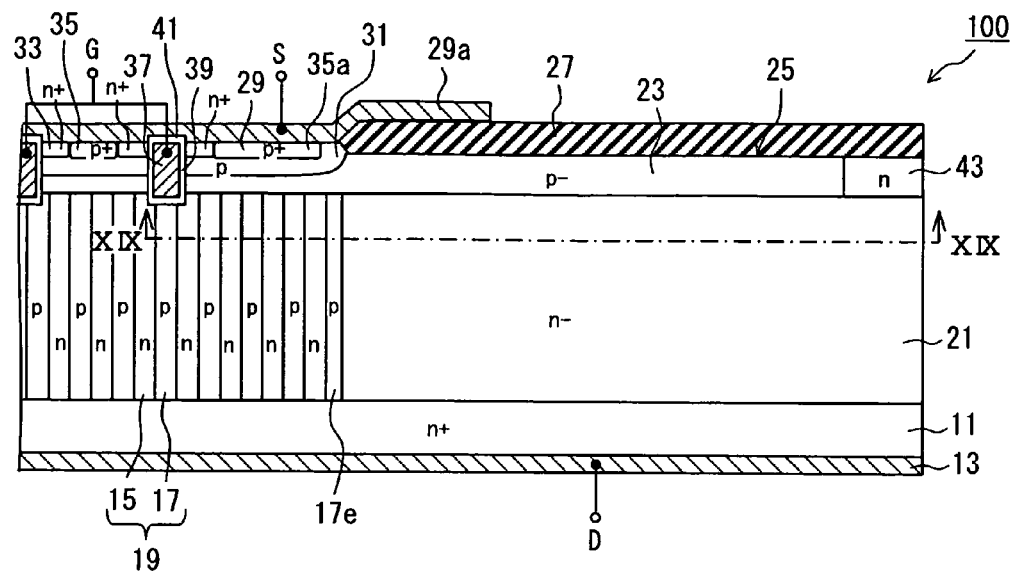
FIG. 18 is a sectional view illustrating the general configuration of a semiconductor device in a fourth embodiment.
Figure 19:
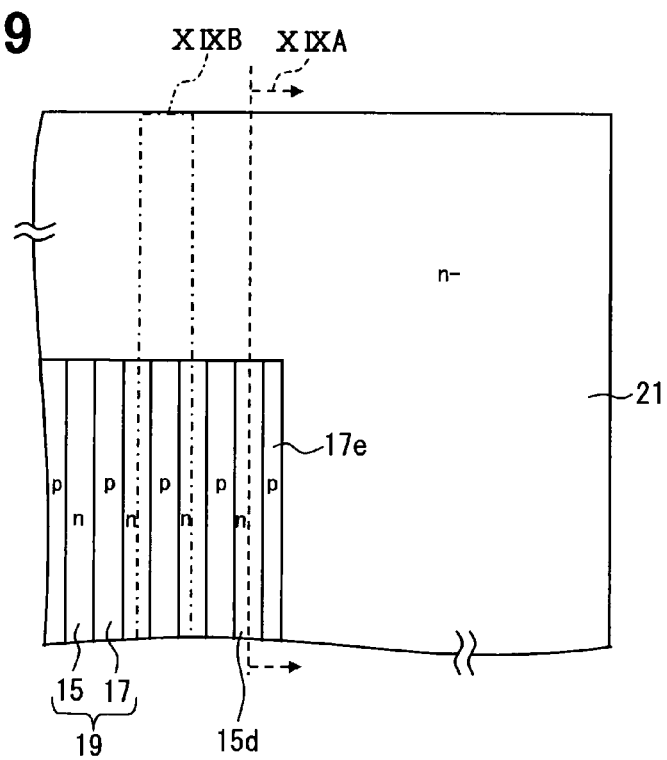
FIG. 19 is a sectional view taken along line XIX-XIX of FIG. 18.

FIG. 18 is a sectional view illustrating the general configuration of a semiconductor device in a fourth embodiment. FIG. 19 is a sectional view taken along line XIX-XIX of FIG. 18. The same elements as components illustrated in FIG. 1 and FIG. 2 or described in relation to the first embodiment, second embodiment, or third embodiment will be marked with the same reference numerals.

The above-mentioned embodiments and their modifications relate to semiconductor devices 100 having a p-n column portion 19 constructed by a trench burying method. In this embodiment, meanwhile, there is no special limitation on the method for the formation of the p-n column portion 19. This embodiment is a proposal of such a construction that a charge balance can be ensured in proximity to an end of the p-n column portion 19 in every semiconductor device 100 having the p-n column portion 19.

In a semiconductor device 100 in this embodiment, as illustrated in FIG. 18 and FIG. 19, the p-n column portion 19 in which an n-type semiconductor layer 15 and a p-type semiconductor layer 17 are alternately and adjacently placed is constructed as follows: in an n⁺-type substrate 11, the epitaxial growth of an n-type semiconductor layer and the selective ion implantation of a p-type impurity are carried out repeatedly (in multiple steps). The semiconductor device in this embodiment basically has the same construction as that of the semiconductor device 100 in the first embodiment except that the method for the formation of the p-n column portion 19 is different, as mentioned above.

With respect to the total impurity amount of some of the p-type semiconductor layers 17 counted from the end of the p-n column portion 19 in the direction of juxtaposition, the following measure is taken: a p-type semiconductor layer 17 is farthest from the end of the p-n column portion 19 of the some of the p-type semiconductor layers 17 counted from the end of the p-n column portion 19; a n-type semiconductor layer 15 adjoining this p-type semiconductor layer 17 on the opposite side to the n⁻-type semiconductor layer 21 is divided into two by a median XIXA in the direction of length; and the above total impurity amount is made substantially equal to the sum of the total impurity amount of the n-type semiconductor layers 15 positioned between the median and the end of the p-n column portion and the impurity amount of the n⁻-type semiconductor layer 21 positioned on the end side.

In this embodiment, one of the p-type semiconductor layers 17 is the end semiconductor layer 17e of the p-n column portion 19 in the direction of juxtaposition. With respect to the impurity amount of the end semiconductor layer 17e, the measure illustrated in FIG. 19 is taken. That is, the n-type semiconductor layer 15d adjoining the end semiconductor layer 17e on the opposite side to the n⁻-type semiconductor layer 21 is divided into two by a median in the direction of length. The impurity amount of the end semiconductor layer 17e is made substantially equal to the sum of the following impurity amounts: the impurity amount of the n-type semiconductor layer 15 (half of the n-type semiconductor layer 15d) positioned between the median and the end semiconductor layer 17e; and the impurity amount of the n⁻-type semiconductor layer 21 positioned on the end semiconductor layer 17e side. More specifically, this embodiment is so constructed that the above relation of impurity amount is met by taking the following measure: the impurity concentration of every p-type semiconductor layer 17 is made substantially equal, and the width of the end semiconductor layer 17e is made smaller than the width of each of the other p-type semiconductor layers 17.

As mentioned above, the semiconductor device 100 in this embodiment is so constructed that the n⁻-type semiconductor layer 21 is provided as the peripheral portion 25 and yet the following can be implemented: a charge balance can be attained in proximity to the end of the p-n column portion 19 as compared with cases where the impurity amount of every p-type semiconductor layer 17 is made substantially equal. Therefore, a depletion layer is more easily extended in the n⁻-type semiconductor layer 21 in the direction perpendicular to the direction of lamination (lateral direction). As a result, it is possible to enhance the breakdown voltage of the peripheral portion 25 more than conventional and thus enhance the breakdown voltage of the entire semiconductor device 100.

The p-type semiconductor layers 17 other than the end semiconductor layer 17e only have to have such a construction that at least a charge balance is ensured between them and the respective halves of the two adjacent n-type semiconductor layers 15 in the direction of juxtaposition. Thus, the breakdown voltage of the p-n column portion 19 can be ensured. However, the n⁻-type semiconductor layer 21 positioned in the direction of length may be taken into account. For example, the impurity amount of one p-type semiconductor layer 17 may be made substantially equal to the sum of the following impurity amounts in the range XIXB indicated by alternate long and short dash line in FIG. 19: the total impurity amount of the respective halves of the two adjacent n-type semiconductor layers 15 in the direction of juxtaposition and the impurity amount of the n$^-$-type semiconductor layer 21 positioned in the direction of length. This makes it possible to enhance the breakdown voltage of the peripheral portion 25 also in the direction of length and thus enhance the breakdown voltage of the entire semiconductor device 100.

Figure 20:
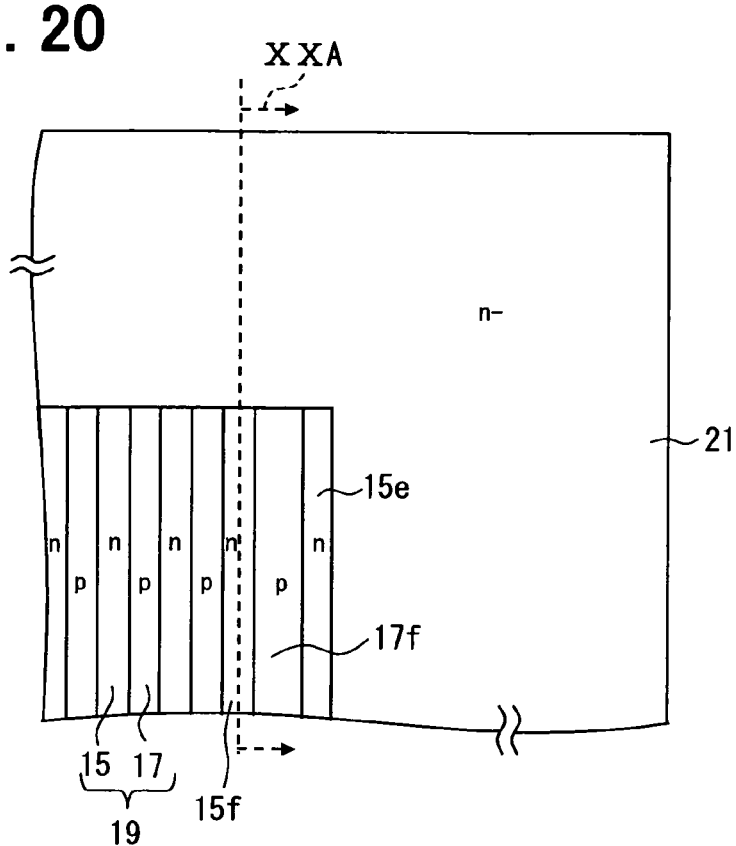
FIG. 20 is a sectional view illustrating a semiconductor device according to a first modification of the fourth embodiment.

In the description of this embodiment, a case where one of the p-type semiconductor layers 17 is the end semiconductor layer 17e of the p-n column portion 19 has been taken as an example. Instead, for example, one of the n-type semiconductor layers 15 may be taken as the end semiconductor layer 15e of the p-n column portion 19 as illustrated in FIG. 20. In this case, there are the end semiconductor layer 15e and the n$^-$-type semiconductor layer 21 between the outermost p-type semiconductor layer 17f of the p-type semiconductor layers 17 and the end in the direction of juxtaposition. With this construction, the measure illustrated in FIG. 20 can be taken with respect to the impurity amount of the outermost p-type semiconductor layer 17f. That is, the n-type semiconductor layer 15f adjoining the p-type semiconductor layer 17f on the opposite side to the n$^-$-type semiconductor layer 21 is divided into two by a median XXA in the direction of length. The impurity amount of the outermost p-type semiconductor layer 17f is made substantially equal to the sum of the following impurity amounts: the impurity amount of the n-type semiconductor layers 15 (half of the n-type semiconductor layer 15f and the end semiconductor layer 15e) positioned between the median and the end semiconductor layer 15e; and the impurity amount of the n$^-$-type semiconductor layer 21 positioned on the end semiconductor layer 15e side. The modification illustrated in FIG. 20 as an example is so constructed that the following is implemented: the impurity concentration of every p-type semiconductor layer 17 is made substantially equal and the width of the outermost p-type semiconductor layer 17f is made larger than the width of each of the other p-type semiconductor layers 17; and the above relation of impurity amount is thereby met. This makes it possible to enhance the breakdown voltage of the peripheral portion 25 more than conventional and thus enhance the breakdown voltage of the entire semiconductor device 100. FIG. 20 is a sectional view illustrating a modification.

In the description of this embodiment, a case where a charge balance is attained between a p-type semiconductor layer and the n$^-$-type semiconductor layer 21 in the direction of juxtaposition by the following has been taken as an example: a charge balance is attained by one (end semiconductor layer 17e, outermost p-type semiconductor layer 17f) of the p-type semiconductor layers 17. However, it may be so constructed that the following is implemented with the total impurity amount of multiple p-type semiconductor layers 17 counted from the end of the p-n column portion 19: a semiconductor layer is the farthest one of the multiple p-type semiconductor layers 17 from the end; the n-type semiconductor layer 15 adjoining this semiconductor layer on the opposite side to the n$^-$-type semiconductor layer 21 is divided into two by a median in the direction of length; and the above total impurity amount is made substantially equal to the sum of the total impurity amount of the n-type semiconductor layers 15 positioned between the median and the end and the impurity amount of the n$^-$-type semiconductor layer 21 positioned on the end side. The following can be implemented by using multiple p-type semiconductor layers 17 to attain a charge balance as mentioned above: it is possible to suppress abrupt change in impurity amount in the direction of juxtaposition and smooth an electric potential distribution when the vertical element is off. That is, the breakdown voltage of the semiconductor device 100 can be further enhanced. Especially, when the impurity amount is gradually varied (increased or reduced) toward the end, it is possible to further smooth an electric potential distribution in off state and thus further enhance the breakdown voltage of the semiconductor device 100.

Figure 21:
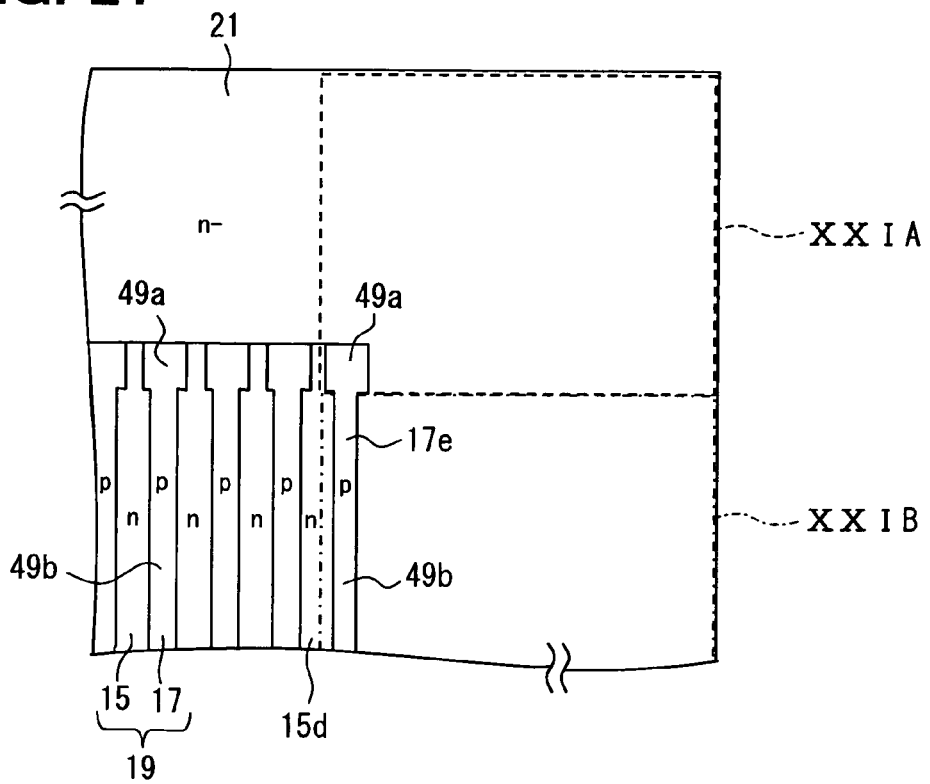
FIG. 21 is a sectional view illustrating a semiconductor device according to a second modification of the fourth embodiment.

In the description of this embodiment, a case where the width of each semiconductor layer 15, 17 constructing the p-n column portion 19 is fixed in the direction of length has been taken as an example. However, a construction that the width is not fixed may be adopted. As illustrated in FIG. 21, for example, the p-type semiconductor layers 17 may be so constructed that the width of their ends 49a in the direction of length is larger than the width of the midportions 49b between the ends 49a. This makes it possible to increase the impurity amount contributing to a charge balance between them and the n$^-$-type semiconductor layer 21 positioned in the direction of length. Especially, the end semiconductor layer 17e (or the outermost p-type semiconductor layer 17f) attains a charge balance with the n$^-$-type semiconductor layer 21 not only in a region in the direction of length. It also attains a charge balance in a region in the direction of juxtaposition and a cross region (corner region) in the direction of juxtaposition and in the direction of length. Therefore, it is presumed that the effect of breakdown voltage enhancement will be most remarkably produced by constructing the invention so that the ends 49a are provided.

FIG. 21 is a sectional view illustrating a modification. In the example illustrated in FIG. 21, every p-type semiconductor layer 17 has the ends 49a and the midportion 49b. Instead, the invention may be so constructed that only the end semiconductor layer 17e (or the outermost p-type semiconductor layer 17f) has the ends 49a and the midportion 49b.

In the example in FIG. 21, the ends 49a are in rectangular shape. Instead, they may be formed in such a shape that their width is gradually increased from the midportion 49b side. ("Gradually" may be continuously or stepwise. FIG. 10 illustrates a case of continuous increase.) Thus, an electric potential distribution in off state is smoothed in the direction of length and thus the breakdown voltage can be further enhanced.

When the ends 49a and the midportions 49b are provided, regions with which a charge balance is attained may be divided by the ends 49a and the midportions 49b, as illustrated in FIG. 21, when designing a charge balance. That is, with respect to the region XXIB (region within the range bounded by alternate long and short dash line) of the n$^-$-type semiconductor layer 21 parallel with the midportion 49b in the direction of juxtaposition, a charge balance is attained at the midportion 49b; and with respect to the other region XXIA (region within the range bounded by broken line), a charge balance is attained at the ends 49a. Also, with respect to the p-type semiconductor layers 17 other than the end semiconductor layer 17e (or the outermost p-type semiconductor layer 17f), the regions with which a charge balance is attained may be divided by the ends 49a and the midportions 49b when designing a charge balance.

In the description of this embodiment, the following case has been taken as an example: a case where the width of the end semiconductor layer 17e is made smaller than the width of each of the other p-type semiconductor layers 17 and its impurity amount is thereby made smaller than the impurity amount of each of the other p-type semiconductor layers 17. Instead, the invention may be so constructed that the following is implemented: the width of every p-type semiconductor layer 17 is fixed; the impurity concentration of the end semiconductor layer 17e is made lower than the impurity concentration of each of the other p-type semiconductor layers 17; and its impurity amount is thereby made smaller than the impurity amount of each of the other p-type semiconductor layers 17. Or, the impurity amount of the end semiconductor layer 17e may be made smaller than the impurity amount of each of the other p-type semiconductor layers 17 by width and impurity concentration.

In the description of this embodiment, a semiconductor device 100 with an n-channel MOSFET incorporated has been taken as an example. However, also in a semiconductor device with a p-channel MOSFET incorporated (construction with the conductivity type switched between p and n), the same or equivalent effect can be expected by applying the above-mentioned constructions.

In the description of this embodiment, a case where an n-well 43 is provided has been taken as an example. Instead, the invention may be constructed without the n-well 43.

Up to this point, description has been given to preferred embodiments of the invention. However, the invention is not limited to the above-mentioned embodiments at all and can be variously modified without departing from the subject matter of the invention when it is embodied.

In the description of the above embodiments, cases where each semiconductor layer is formed of silicon have been taken as examples. However, silicon need not be used and any other semiconductor, such as SiC, than silicon can be adopted.

In the description of the above embodiments, cases where MOSFET is used as the vertical element having the p-n column portion 19 have been taken as examples. However, the vertical element need not be MOSFET and any other element, such as IGBT, than MOSFET can be applied. The gate electrode of the vertical element need not be of the above-mentioned trench structure and may be of the planar structure.

Figure 22:
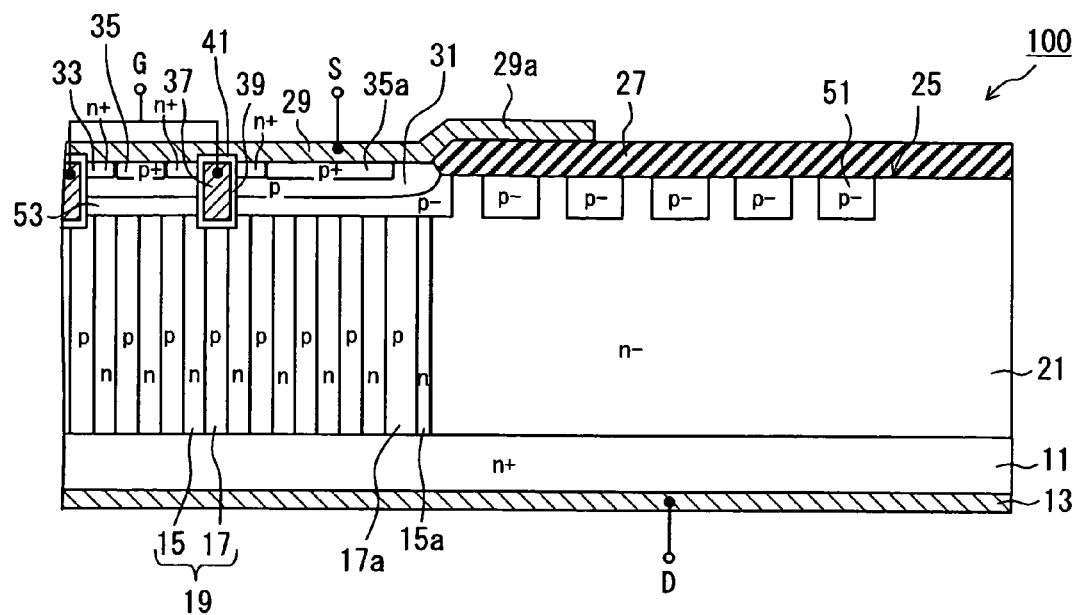
FIG. 22 is a sectional view illustrating a semiconductor device according to a third modification of the fourth embodiment.

In the description of the above embodiments, cases where the p$^-$-type semiconductor layer 23 is continuously formed astride the p-n column portion 19 and the n$^-$-type semiconductor layer 21 have been taken as examples. That is, cases where part of the p$^-$-type semiconductor layer 23 disposed over the n$^-$-type semiconductor layer 21 as the peripheral portion 25 is electrically connected with the source electrode 29 have been taken as examples. With this construction, part of the p$^-$-type semiconductor layer 23 disposed over the n$^-$-type semiconductor layer 21 is fixed at a predetermined potential; therefore, a depletion layer can be more easily extended in the n$^-$-type semiconductor layer 21 in the lateral direction. However, the invention may be constructed as illustrated in FIG. 22. That is, it may be so constructed that p$^-$-type semiconductor layers 51 disposed over the n$^-$-type semiconductor layer 21 are not electrically connected with the source electrode 29 and are set to floating potential. Even with this construction, a depletion layer is expanded from junctions between the p$^-$-type semiconductor layers 51 and the n$^-$-type semiconductor layer 21, though not so much as with the above construction involving fixation at a predetermined potential. Therefore, the breakdown voltage can be enhanced by adopting the construction of any of the above embodiments. For example, the p$^-$-type semiconductor layers 51 can be so constructed that the following conditions are met: the width is 0.5 μm to 10 μm or so; the interval between adjoining p$^-$-type semiconductor layers 51 is 1 to 10 μm; the thickness in the direction of lamination is 0.2 μm to 10 μm; and the impurity concentration is higher (denser) than that of the n$^-$-type semiconductor layer 21, for example, $1\times10^{15}$ cm$^{-3}$ to $3\times10^{16}$ cm$^{-3}$. In the example illustrated in FIG. 22, the position of the end of the field plate 29a overlaps with the position of a p$^-$-type semiconductor layer 51 in the direction of juxtaposition. In this case, electric field concentration can be mitigated under the end of the field plate 29a. In the example illustrated in FIG. 22, multiple (five in the drawing) p$^-$-type semiconductor layers 51 are disposed over the n$^-$-type semiconductor layer 21 in the peripheral portion 25. However, there is no special limitation on the number of p$^-$-type semiconductor layers 51. FIG. 22 is a sectional view illustrating another modification and reference numeral 53 in the drawing denotes a p-type semiconductor layer electrically isolated from the p$^-$-type semiconductor layers 51.

Figure 23:
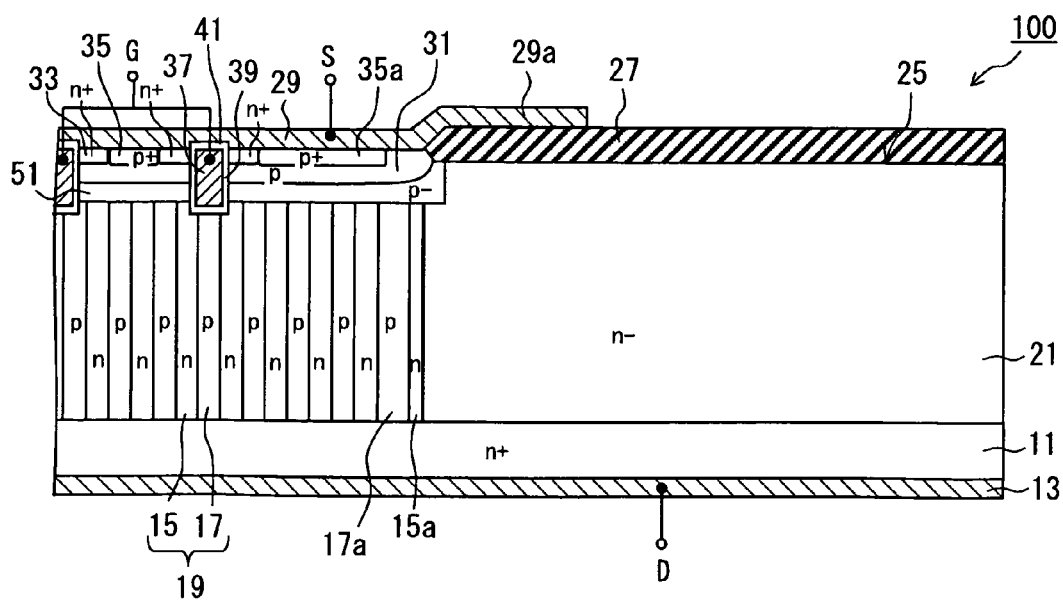
FIG. 23 is a sectional view illustrating a semiconductor device according to a fourth modification of the fourth embodiment.

The invention may be constructed as illustrated in FIG. 23. That is, the following construction may be adopted: the p$^-$-type semiconductor layer 23 (or the p$^-$-type semiconductor layer 51) is not provided and the field oxide film 27 is disposed on the n$^-$-type semiconductor layer 21 in direct contact. In this case, though the effect produced by the p$^-$-type semiconductor layer 23 (or the p$^-$-type semiconductor layer 51) is eliminated, the breakdown voltage can be enhanced by adopting the construction of any of the above embodiments. FIG. 23 is a sectional view illustrating another modification.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
   a first semiconductor layer having a first conductivity type;
   a p-n column portion stacked over the first semiconductor layer and including a plurality of second semiconductor layers and a plurality of third semiconductor layers, wherein each second semiconductor layer has the first conductivity type and provides a drift layer, each third semiconductor layer has a second conductivity type, and the second and third semiconductor layers are alternately and adjacently arranged in a juxtaposing direction perpendicular to a stacking direction of the p-n column portion; and
   a peripheral portion disposed adjacently to the p-n column portion in the juxtaposing direction and including at least a fourth semiconductor layer with the first conductivity type,
   wherein the fourth semiconductor layer has an impurity concentration lower than each second semiconductor layer,
   wherein the second semiconductor layers include an end second semiconductor layer, which contacts the peripheral portion in the juxtaposing direction,
   wherein the end second semiconductor layer has an impurity amount, which is equal to or larger than a half of an impurity amount of other second semiconductor layers,
   wherein the third semiconductor layers include a large impurity amount portion adjacent to the end second semiconductor layer,
   wherein the large impurity amount portion includes at least one third semiconductor layer having an impurity amount, which is larger than an impurity amount of other third semiconductor layers, wherein all of the third semiconductor layers including the at least one third semiconductor layer have substantially a same impurity concentration, and wherein the at least one third semiconductor layer in the large impurity amount portion has a width, which is larger than a width of the other third semiconductor layers.

2. The semiconductor device of claim 1, wherein a total impurity amount of the large impurity amount portion is equal to or smaller than a sum of an impurity amount of the fourth semiconductor layer and a total impurity amount of a part of the second semiconductor layers disposed between a boundary and a middle line, and wherein the boundary is defined between the p-n column portion and the peripheral portion, and the middle line is defined as a center line of one of the second semiconductor layers, which is adjacent to the large impurity amount portion and opposite to the end second semiconductor layer.

3. The semiconductor device of claim 1, wherein all of the third semiconductor layers have substantially a same width along with a direction perpendicular to the juxtaposing direction and perpendicular to the stacking direction.

4. The semiconductor device of claim 1, wherein each of the third semiconductor layers has one end in a direction perpendicular to the juxtaposing direction and perpendicular to the stacking direction, and wherein the one end of the third semiconductor layer has a width in the juxtaposing direction, which is larger than a width of a middle portion of the third semiconductor layer.

5. The semiconductor device of claim 1, wherein the large impurity amount portion includes more than one third semiconductor layer.

6. The semiconductor device of claim 5, wherein one third semiconductor layer in the large impurity amount portion has an impurity amount, which is larger than another third semiconductor layer in the large impurity amount portion, and the one third semiconductor layer is disposed near the end second semiconductor layer, and the another third semiconductor layer is disposed far from the end second semiconductor layer.

* * * * *